(12) United States Patent
Kang et al.

(10) Patent No.: US 12,302,632 B2
(45) Date of Patent: *May 13, 2025

(54) NON-PLANAR INTEGRATED CIRCUIT STRUCTURES HAVING MITIGATED SOURCE OR DRAIN ETCH FROM REPLACEMENT GATE PROCESS

(71) Applicant: Intel Corporation, Santa Clara, CA (US)

(72) Inventors: Jun Sung Kang, Portland, OR (US); Kai Loon Cheong, Beaverton, OR (US); Erica J. Thompson, Beaverton, OR (US); Biswajeet Guha, Hillsboro, OR (US); William Hsu, Hillsboro, OR (US); Dax M. Crum, Beaverton, OR (US); Tahir Ghani, Portland, OR (US); Bruce Beattie, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/523,637

(22) Filed: Nov. 29, 2023

(65) Prior Publication Data
US 2024/0096896 A1 Mar. 21, 2024

Related U.S. Application Data

(62) Division of application No. 16/146,808, filed on Sep. 28, 2018, now Pat. No. 11,869,891.

(51) Int. Cl.
*H10D 84/85* (2025.01)
*H10D 30/01* (2025.01)
(Continued)

(52) U.S. Cl.
CPC ......... *H10D 84/853* (2025.01); *H10D 30/024* (2025.01); *H10D 30/62* (2025.01);
(Continued)

(58) Field of Classification Search
CPC ......... H01L 27/0924; H01L 21/823814; H01L 21/823821; H01L 21/823864;
(Continued)

(56) References Cited

U.S. PATENT DOCUMENTS 9,871,121 B2 1/2018 Xu
10,229,986 B1 3/2019 Jagannathan
(Continued)

*Primary Examiner* — Monica D Harrison
*Assistant Examiner* — Andre C Stevenson
(74) *Attorney, Agent, or Firm* — Schwabe, Williamson & Wyatt P.C.

(57) ABSTRACT

Non-planar integrated circuit structures having mitigated source or drain etch from replacement gate process are described. For example, an integrated circuit structure includes a fin or nanowire. A gate stack is over the fin or nanowire. The gate stack includes a gate dielectric and a gate electrode. A first dielectric spacer is along a first side of the gate stack, and a second dielectric spacer is along a second side of the gate stack. The first and second dielectric spacers are over at least a portion of the fin or nanowire. An insulating material is vertically between and in contact with the portion of the fin or nanowire and the first and second dielectric spacers. A first epitaxial source or drain structure is at the first side of the gate stack, and a second epitaxial source or drain structure is at the second side of the gate stack.

20 Claims, 19 Drawing Sheets

(51) Int. Cl.
*H10D 30/62* (2025.01)
*H10D 62/10* (2025.01)
*H10D 62/832* (2025.01)
*H10D 64/01* (2025.01)
*H10D 64/27* (2025.01)
*H10D 64/68* (2025.01)
*H10D 84/01* (2025.01)
*H10D 84/03* (2025.01)

(52) U.S. Cl.
CPC ......... *H10D 62/121* (2025.01); *H10D 62/832* (2025.01); *H10D 64/017* (2025.01); *H10D 64/021* (2025.01); *H10D 64/513* (2025.01); *H10D 64/693* (2025.01); *H10D 84/017* (2025.01); *H10D 84/0184* (2025.01); *H10D 84/0193* (2025.01); *H10D 84/038* (2025.01)

(58) Field of Classification Search
CPC ............... H01L 29/0673; H01L 29/161; H01L 29/4236; H01L 29/518; H01L 29/66545; H01L 29/6656; H01L 29/66795; H01L 29/785
See application file for complete search history.

(56) References Cited

U.S. PATENT DOCUMENTS

| | | | |
|---|---|---|---|
| 11,869,891 B2 * | 1/2024 | Kang | H01L 29/0673 |
| 2015/0357440 A1 | 12/2015 | Cheng | |
| 2016/0182023 A1 * | 6/2016 | Morris | G11C 11/419 |
| | | | 327/333 |
| 2019/0006506 A1 * | 1/2019 | Greene | H10D 30/024 |

* cited by examiner

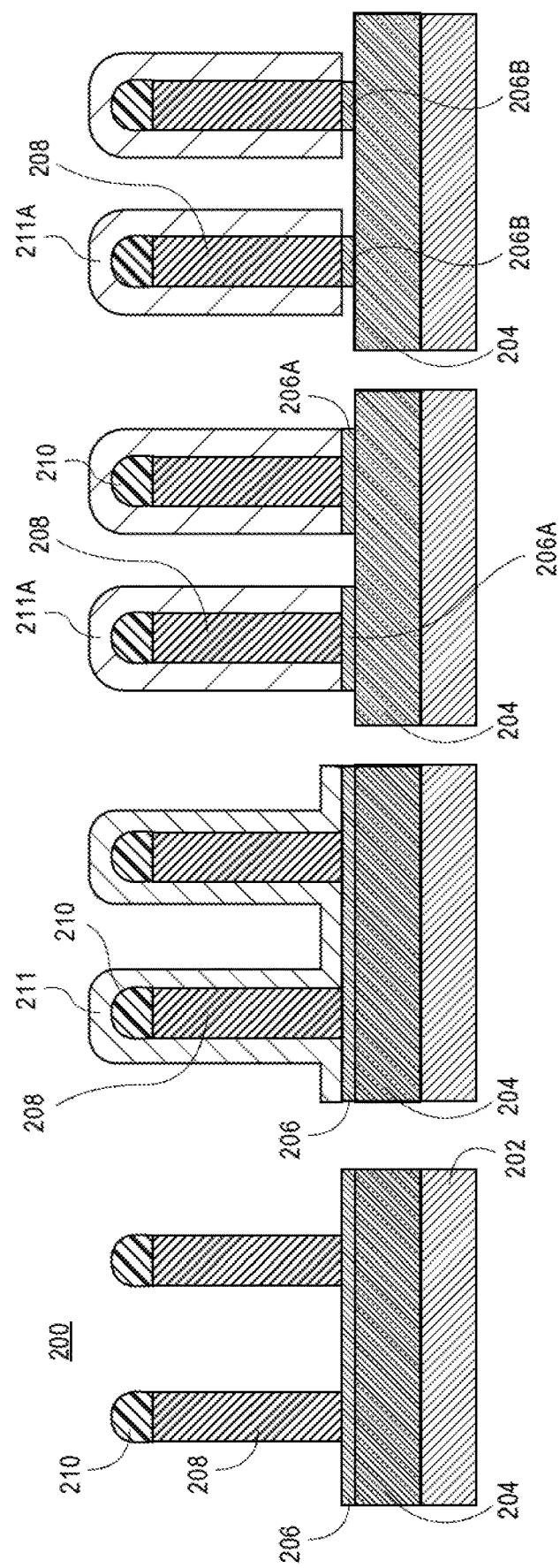

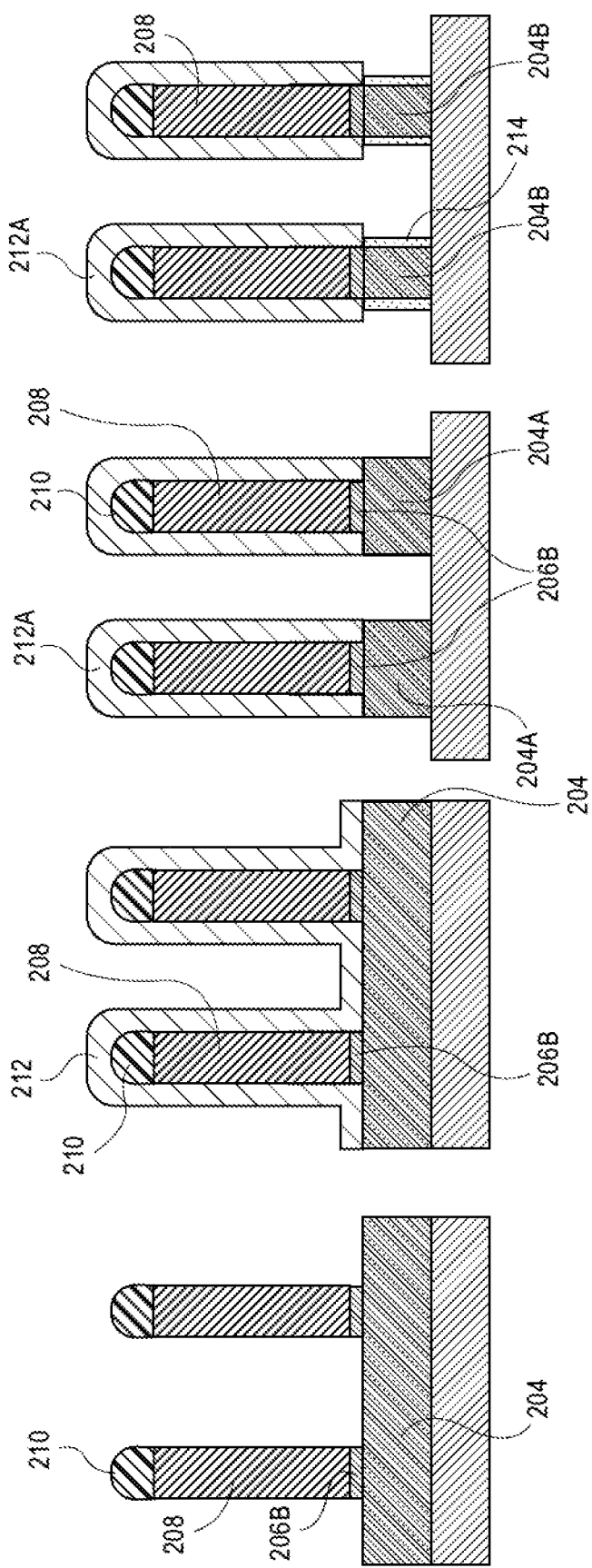

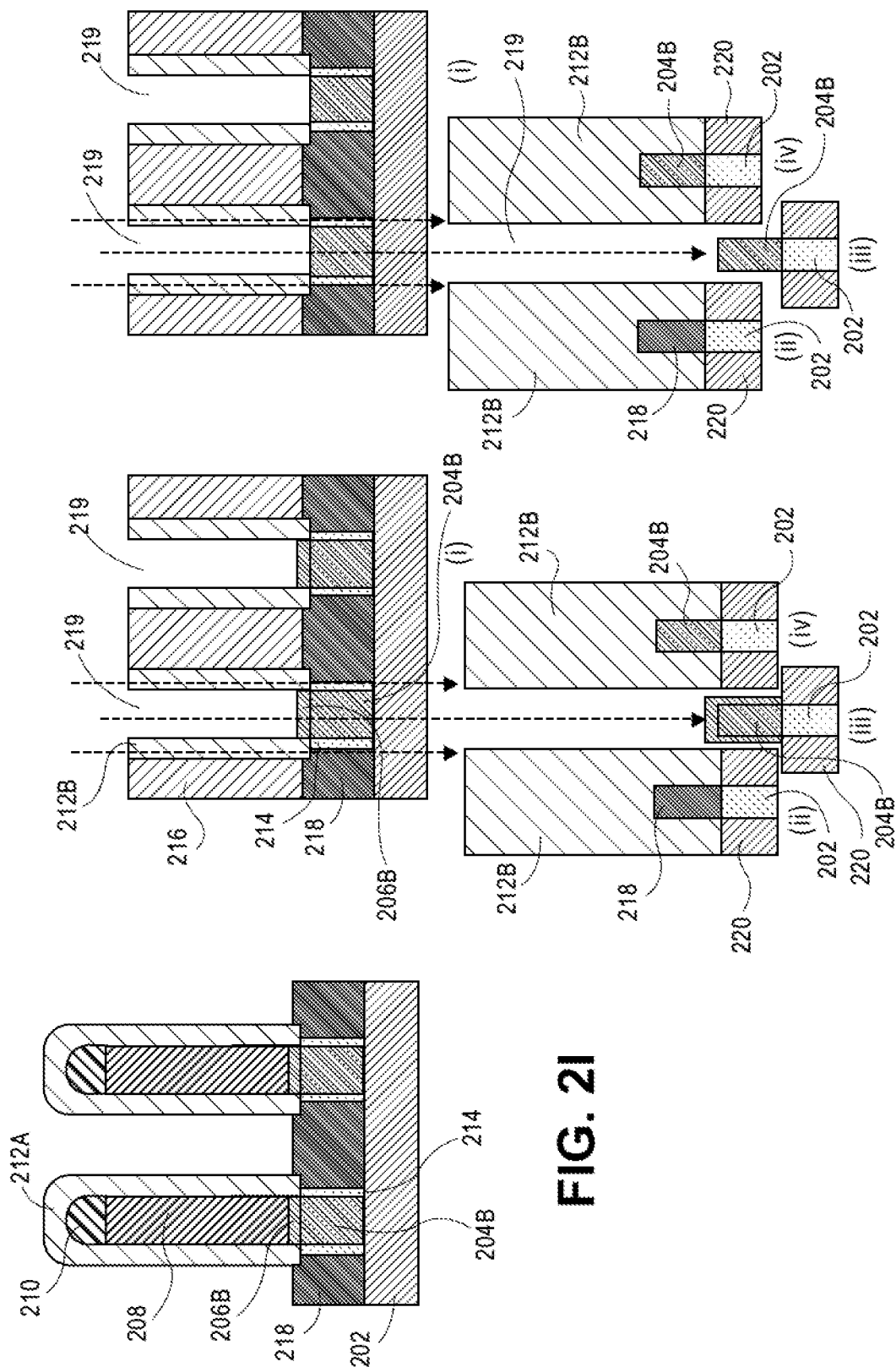

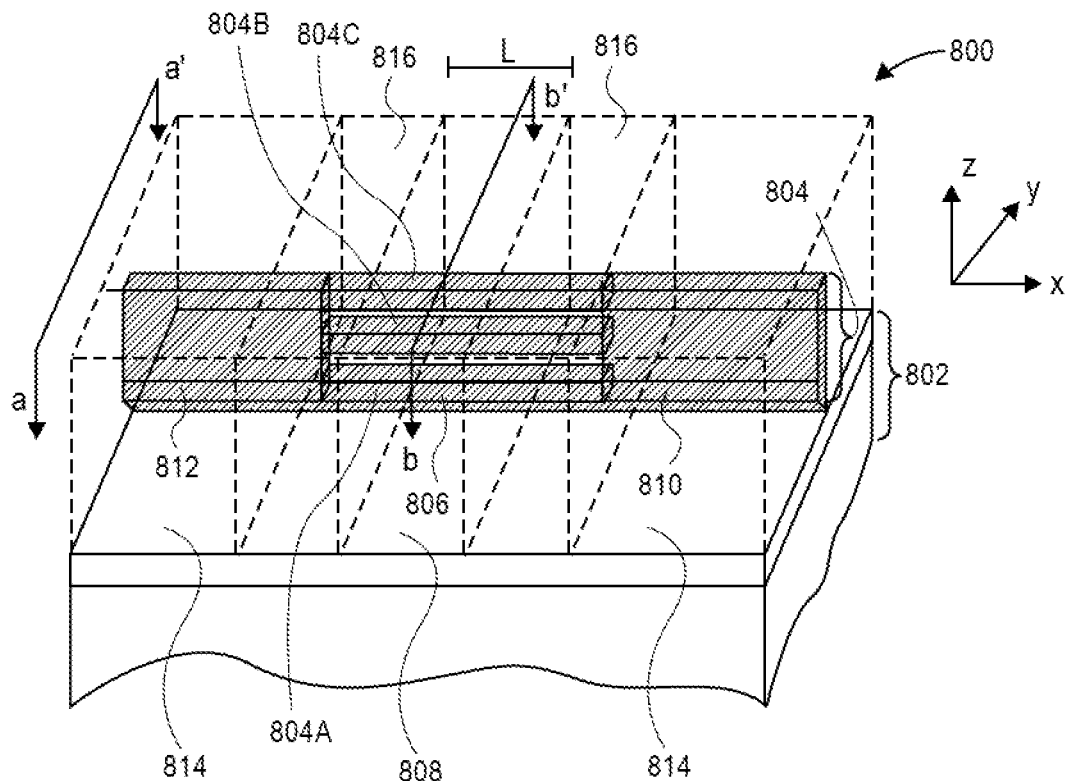
FIG. 8A
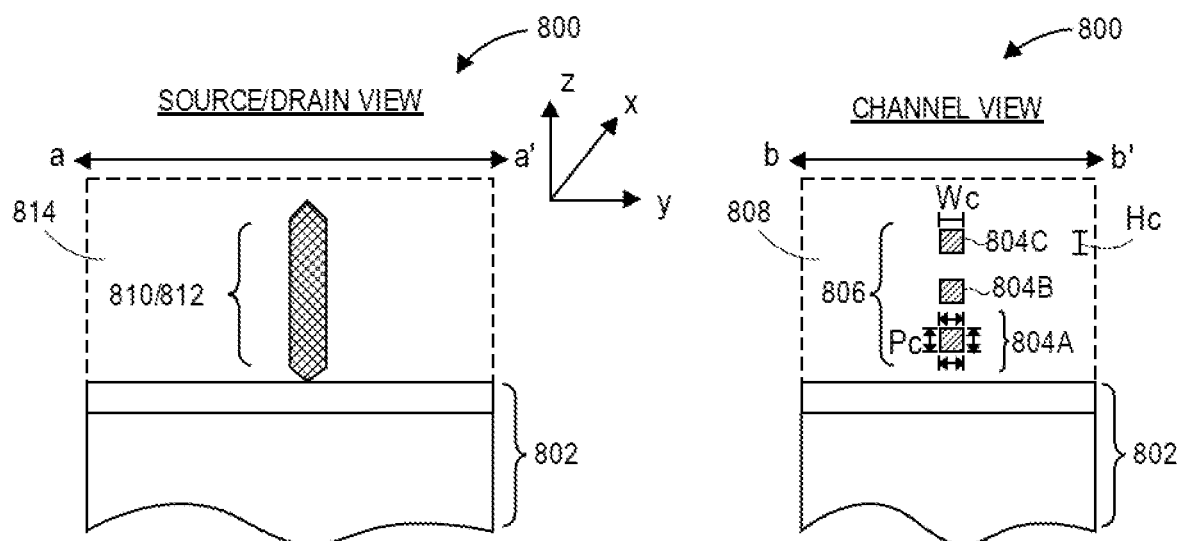
FIG. 8B
FIG. 8C

NON-PLANAR INTEGRATED CIRCUIT STRUCTURES HAVING MITIGATED SOURCE OR DRAIN ETCH FROM REPLACEMENT GATE PROCESS

CROSS-REFERENCE TO RELATED APPLICATIONS

This application is a division of U.S. patent application Ser. No. 16/146,808, filed on Sep. 28, 2018, the entire contents of which is hereby incorporated by reference herein.

TECHNICAL FIELD

Embodiments of the disclosure are in the field of integrated circuit structures and processing and, in particular, non-planar integrated circuit structures having mitigated source or drain etch from replacement gate process.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 2A-2K illustrate cross-sectional views representing various operations in a method of fabricating a non-planar integrated circuit structure having mitigated source or drain etch from replacement gate process, in accordance with an embodiment of the present disclosure.

FIG. 8A illustrates a three-dimensional cross-sectional view of a nanowire-based integrated circuit structure, in accordance with an embodiment of the present disclosure.

FIG. 8B illustrates a cross-sectional source or drain view of the nanowire-based integrated circuit structure of FIG. 8A, as taken along the a-a' axis, in accordance with an embodiment of the present disclosure.

FIG. 8C illustrates a cross-sectional channel view of the nanowire-based integrated circuit structure of FIG. 8A, as taken along the b-b' axis, in accordance with an embodiment of the present disclosure.

DESCRIPTION OF THE EMBODIMENTS

Figure 1A:
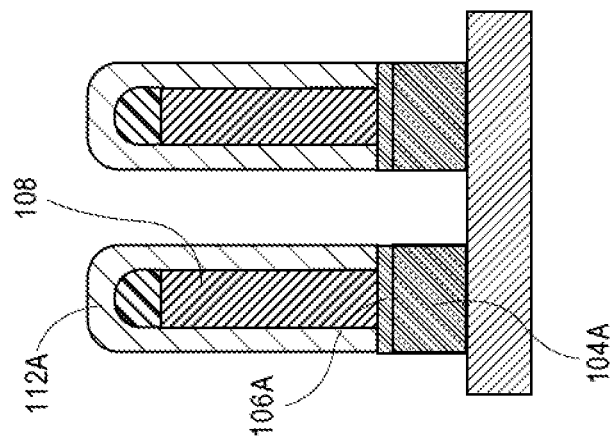
FIGS. 1A-1G illustrate cross-sectional views representing various operations in a method of fabricating a non-planar integrated circuit structure using a replacement gate process.

Non-planar integrated circuit structures having mitigated source or drain etch from replacement gate process are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to approaches for minimizing fin or nanowire source or drain etch out during a dummy gate removal process. Embodiments may be implemented in order to effectively eliminate a path for source or drain material loss during dummy gate removal. In one embodiment, a pathway otherwise created by removal of a protective oxide material from beneath a gate spacer is eliminated or mitigated, e.g., by eliminating such a thin silicon oxide path between a transistor source or drain structure and a gate. The approach may prevent source or drain loss during dummy gate removal and subsequent process operations where source or drain loss may otherwise occur, e.g., channel shaping or channel thinning operations.

To provide context, current integrated processing schemes may retain a thin oxide during gate spacer deposition. By contrast, in accordance with an embodiment of the present disclosure, such a thin oxide is removed up to, but not under, a gate edge using a temporary (e.g., sacrificial) spacer, followed by a controlled oxide removal (e.g., targeted to the gate edge). Advantages of implementing embodiments described herein may include the elimination of a path between the gate and source or drain structures through which etch species used for dummy gate removal can otherwise travel, e.g., silicon etches can often attack source or drain material. Other processing that can typically involve source or drain structure etch-out, but which may be eliminated or mitigated using embodiments described herein, may include fin thinning operations, nanowire or nanoribbon release operations (e.g., SiGe etches). Furthermore, it is to be appreciated that, as devices scale, spacer thickness is often reduced, pushing the source or drain structures closer the gate. Embodiments may be implemented to facilitate such scaling.

To provide further context, current processing schemes can involve fabrication of a gate spacer deposited over a dummy gate oxide. Subsequent processes may require removal of such a dummy gate oxide. Process schemes treating the channel at a replacement gate stage (e.g., fin thinning, nanowire/nanoribbon release or shaping) may impact the source or drain structures. As an example, FIGS. 1A-1G illustrate cross-sectional views representing various operations in a method of fabricating a non-planar integrated circuit structure using a replacement gate process.

Referring to FIG. 1A, a starting structure 100 includes a substrate portion 102 having a fin 104 thereon. The substrate portion may be a semiconductor material, such as a silicon substrate portion, or may be an insulating material, such as an oxide of an SOI substrate. In one embodiment, the fin 104 is continuous with the substrate portion 102, such as a silicon fin continuous with a silicon substrate portion. In a particular embodiment, substrate portion 102 is a lower fin portion, and fin 104 is an upper fin portion. A dummy gate oxide 106, such as a thermally grown or chemically deposited silicon oxide (or silicon dioxide) layer, is on the fin 104. Dummy gate electrodes 108 with a corresponding hardmask 110 are over the dummy gate oxide 106 on the fin 104.

Figure 1B:
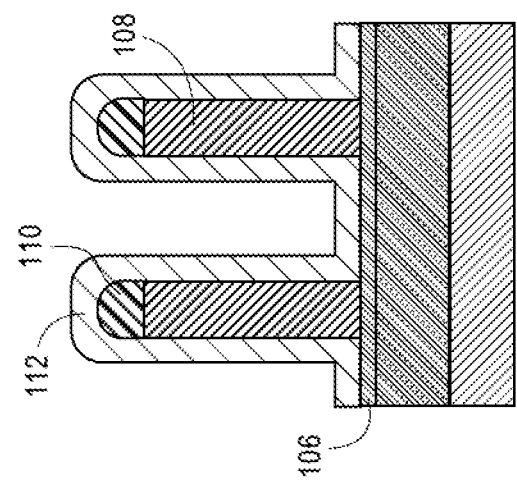

Referring to FIG. 1B, a spacer forming material layer 112, such as a silicon nitride or carbon-doped silicon nitride layer, is formed on the structure of FIG. 1A.

Figure 1C:
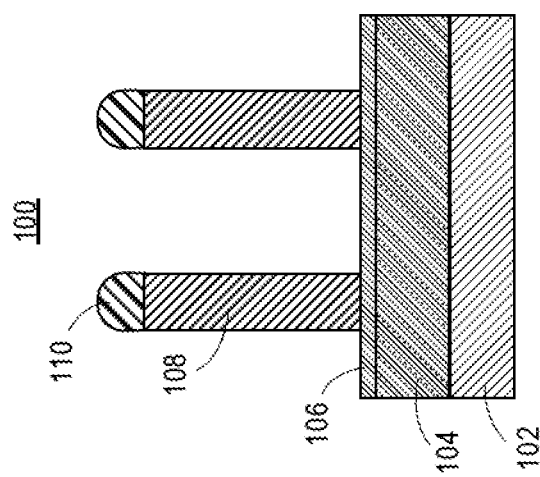

Referring to FIG. 1C, spacer forming material layer 112 is anisotropically etched to form gate spacer precursor 112A. Additionally, dummy gate oxide 106 is patterned to form patterned dummy gate oxide 106A, and portions of fin 104 are removed to form fin portions 104A as an epitaxial "undercut" process for later source or drain formation. A portion of the patterned dummy gate oxide 106A is beneath the gate spacer precursor 112A.

Figure 1D:
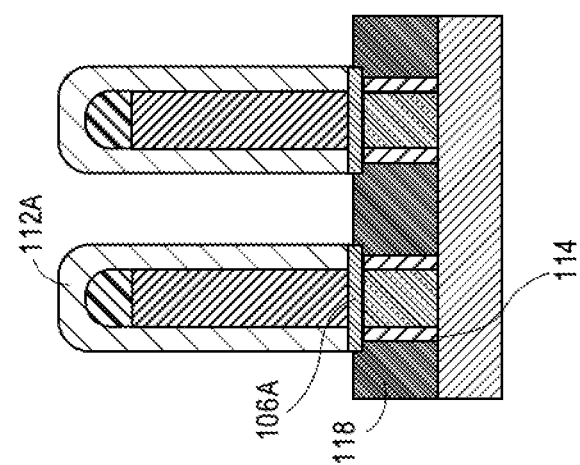

Referring to FIG. 1D, tip regions 114 are formed at exposed sides of the fin portions 104A to form fin channels 104B. The tip regions 114 may be formed by implantation and/or by epitaxial growth.

Figure 1E:
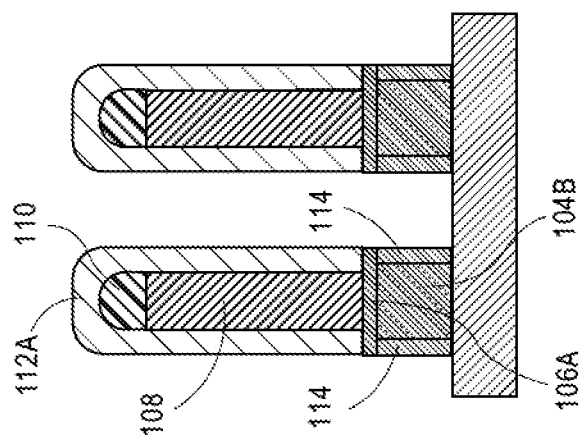

Referring to FIG. 1E, epitaxial source or drain structures 118 are formed adjacent the fin channels 104B, e.g., on the tip regions 114. In one embodiment, the epitaxial source or drain structures 118 contact the patterned dummy gate oxide 106A, e.g., the epitaxial source or drain structures 118 contact the portion of patterned dummy gate oxide 106A beneath the gate spacer precursor 112A.

Figure 1F:
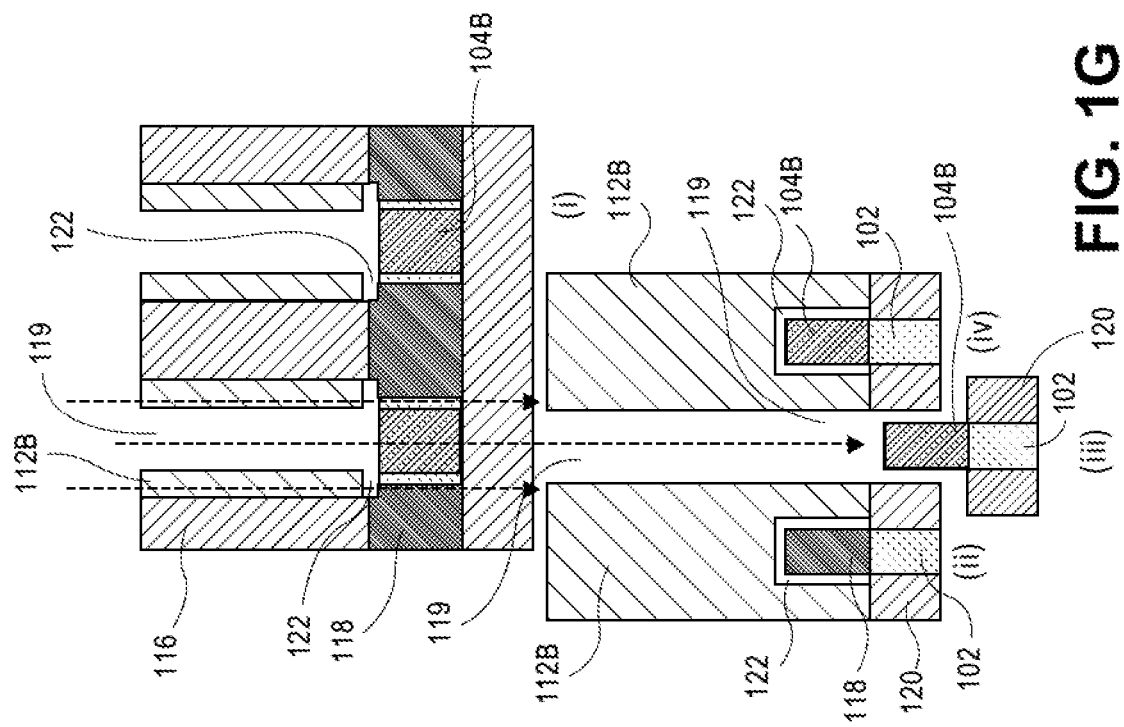

Referring to FIG. 1F, structure (i) shows the same cross-sectional perspective depicted in FIGS. 1A-1E. Structure (ii) shows a cross-sectional view taken through a location of the left arrow, structure (iii) shows a cross-sectional view taken through a location of the middle arrow, and structure (iv) shows a cross-sectional view taken through a location of the right arrow. FIG. 1F represents the structure of FIG. 1E following inter-layer dielectric (ILD) material formation and planarization of the ILD material, gate spacer precursor 112A and hardmask 110. The planarization forms ILD regions 116 and gate spacers 112B and exposes dummy gate structures 108 which are subsequently removed to form trenches 119. Also depicted in structures (i), (ii) and (iii) are shallow trench isolation (STI) regions 120 adjacent the substrate portion 102.

Figure 1G:
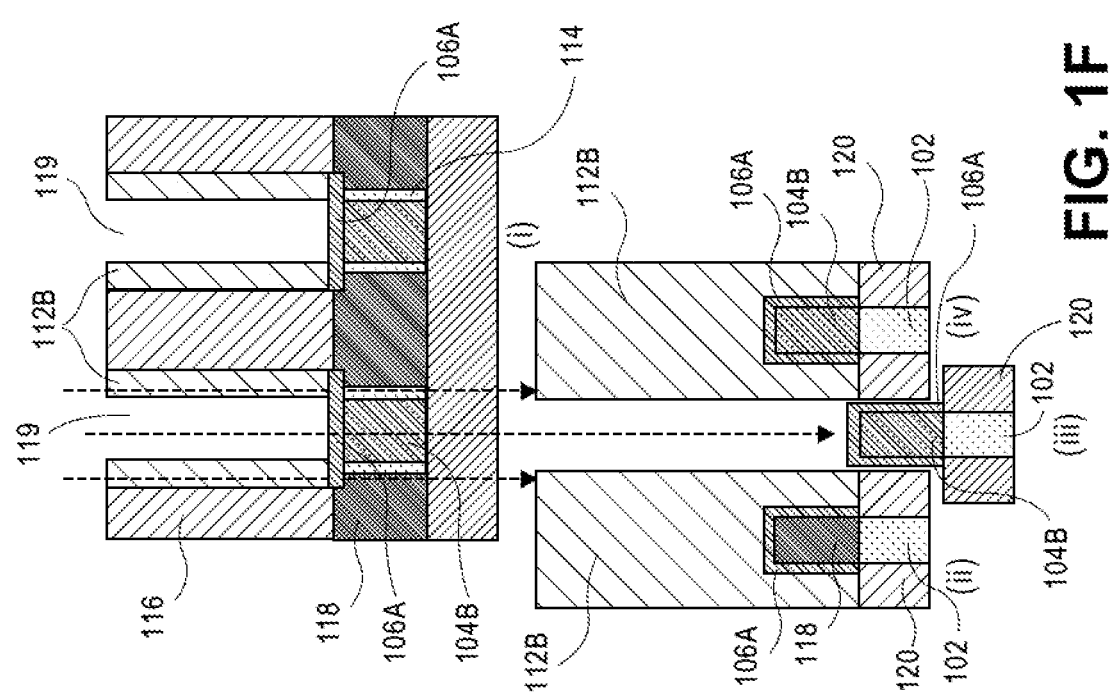

Referring to FIG. 1G, the patterned dummy gate oxide 106A of FIG. 1F is removed. Removal of the patterned dummy gate oxide 106A forms openings or pathways 122 beneath the gate spacers 112B which expose portions of the epitaxial source or drain structures 118. The processing used to remove the patterned dummy gate oxide 106A may detrimentally etch a portion of the epitaxial source or drain structures 118. In addition, or alternatively, subsequent processing performed through trenches 119, such as channel shaping or nanowire release prior to permanent gate stack formation in trenches 119, may detrimentally etch a portion of the epitaxial source or drain structures 118.

In accordance with an embodiment of the present disclosure, in contrast to the process described in association with FIGS. 1A-1G, a fabrication process involves replacement of the dummy gate oxide layer with a spacer material or with solid by-products. Replaced materials may be engineered to be more resistant to hydrofluoric acid (HF) or other isotropic precleans. Processing schemes described below may provide a more robust barrier to dummy gate removal and processing performed between dummy gate removal and permanent gate formation.

As an example of a process scheme involving replacement of a dummy gate oxide layer with a spacer material, FIGS. 2A-2K illustrate cross-sectional views representing various operations in a method of fabricating a non-planar integrated circuit structure having mitigated source or drain etch from replacement gate process, in accordance with an embodiment of the present disclosure.

Referring to FIG. 2A, a starting structure 200 includes a substrate portion 202 having a fin 204 thereon. The substrate portion may be a semiconductor material, such as a silicon substrate portion, or may be an insulating material, such as an oxide of an SOI substrate. In one embodiment, the fin 204 is continuous with the substrate portion 202, such as a silicon fin continuous with a silicon substrate portion. In a particular embodiment, substrate portion 202 is a lower fin portion, and fin 204 is an upper fin portion. A dummy gate oxide 206, such as a thermally grown or chemically deposited silicon oxide (or silicon dioxide) layer, is on the fin 204. Dummy gate electrodes 208 with a corresponding hardmask 210 are over the dummy gate oxide 206 on the fin 204.

Referring to FIG. 2B, a first spacer forming material layer 211, such as a silicon nitride or carbon-doped silicon nitride layer, is formed on the structure of FIG. 2A.

Referring to FIG. 2C, first spacer forming material layer 211 is anisotropically etched to form sacrificial gate spacer 211A. Additionally, dummy gate oxide 206 is patterned to form patterned dummy gate oxide 206A.

Referring to FIG. 2D, portions of patterned dummy gate oxide 206A beneath sacrificial gate spacer 211A are etched to form recessed dummy gate oxide 206B. In an embodiment, portions of patterned dummy gate oxide 206A beneath sacrificial gate spacer 211A are etched using an isotropic etch, such as a wet etch based on hydrofluoric acid. In an embodiment, recessed dummy gate oxide 206B is flush with the edges of dummy gate 208, as is depicted. In other embodiments, recessed dummy gate oxide 206B extends slightly beyond the edges of dummy gate 208. In other embodiments, recessed dummy gate oxide 206B extends slightly beneath the edges of dummy gate 208.

Referring to FIG. 2E, the sacrificial gate spacer 211A is removed from the structure of FIG. 2D. In an embodiment, the sacrificial gate spacer 211A is removed using an isotropic etch, such as a wet etch process.

Referring to FIG. 2F, a spacer forming material layer 212, such as a silicon nitride or carbon-doped silicon nitride layer, is formed on the structure of FIG. 2E.

Referring to FIG. 2G, spacer forming material layer 212 is anisotropically etched to form gate spacer precursor 212A. Additionally, portions of fin 204 are removed to form fin portions 204A as an epitaxial "undercut" process for later source or drain formation.

Referring to FIG. 2H, optionally, tip regions 214 are formed at exposed sides of the fin portions 204A to form fin channels 204B. The tip regions 214 may be formed by implantation and/or by epitaxial growth.

Referring to FIG. 2I, epitaxial source or drain structures 218 are formed adjacent the fin channels 204B, e.g., on the tip regions 214. In one embodiment, as depicted, the epitaxial source or drain structures 218 are inhibited by gate spacer precursor 212A from contacting the recessed dummy gate oxide 206B.

Referring to FIG. 2J, structure (i) shows the same cross-sectional perspective depicted in FIGS. 2A-2I. Structure (ii) shows a cross-sectional view taken through a location of the left arrow, structure (iii) shows a cross-sectional view taken through a location of the middle arrow, and structure (iv) shows a cross-sectional view taken through a location of the right arrow. FIG. 2J represents the structure of FIG. 2I following inter-layer dielectric (ILD) material formation and planarization of the ILD material, gate spacer precursor 212A and hardmask 210. The planarization forms ILD regions 216 and gate spacers 212B and exposes dummy gate structures 208 which are subsequently removed to form trenches 219. Also depicted in structures (i), (ii) and (iii) are shallow trench isolation (STI) regions 220 adjacent the substrate portion 202.

Referring to FIG. 2K, the recessed dummy gate oxide 206B of FIG. 2J is removed. In accordance with an embodiment of the present disclosure, and in contrast to FIG. 1G, removal of the recessed dummy gate oxide 206B does not form openings or pathways beneath the gate spacers 212B to the epitaxial source or drain structures 218. Accordingly, in an embodiment, the processing used to remove the recessed dummy gate oxide 206B does not access the epitaxial source or drain structures 218. Additionally, in an embodiment, subsequent processing performed through trenches 219, such as channel shaping or nanowire release prior to permanent gate stack formation in trenches 219, does not access the epitaxial source or drain structures 218 beneath the gate spacers 212B. It is to be appreciated that following such removal of recessed dummy gate oxide 206B or such channel shaping or nanowire release, a permanent gate dielectric and a permanent gate electrode may be formed in trenches 219.

Figure 3B:
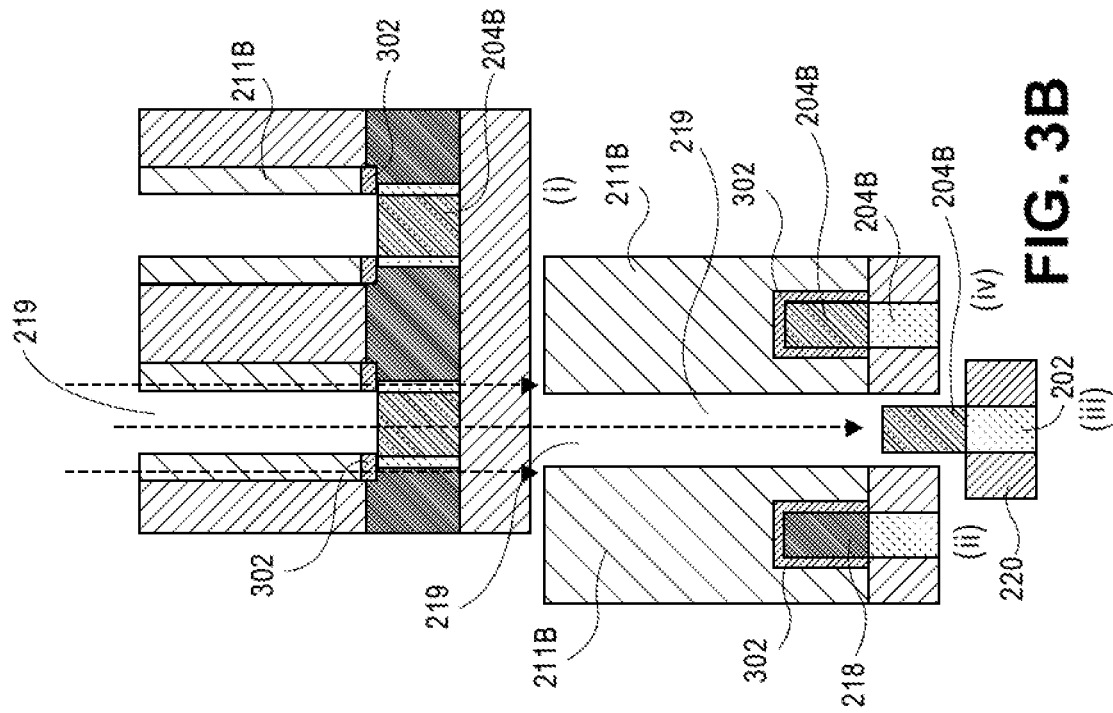
FIGS. 3A-3B illustrate cross-sectional views representing various operations in another method of fabricating a non-planar integrated circuit structure having mitigated source or drain etch from replacement gate process, in accordance with another embodiment of the present disclosure.
Figure 3A:
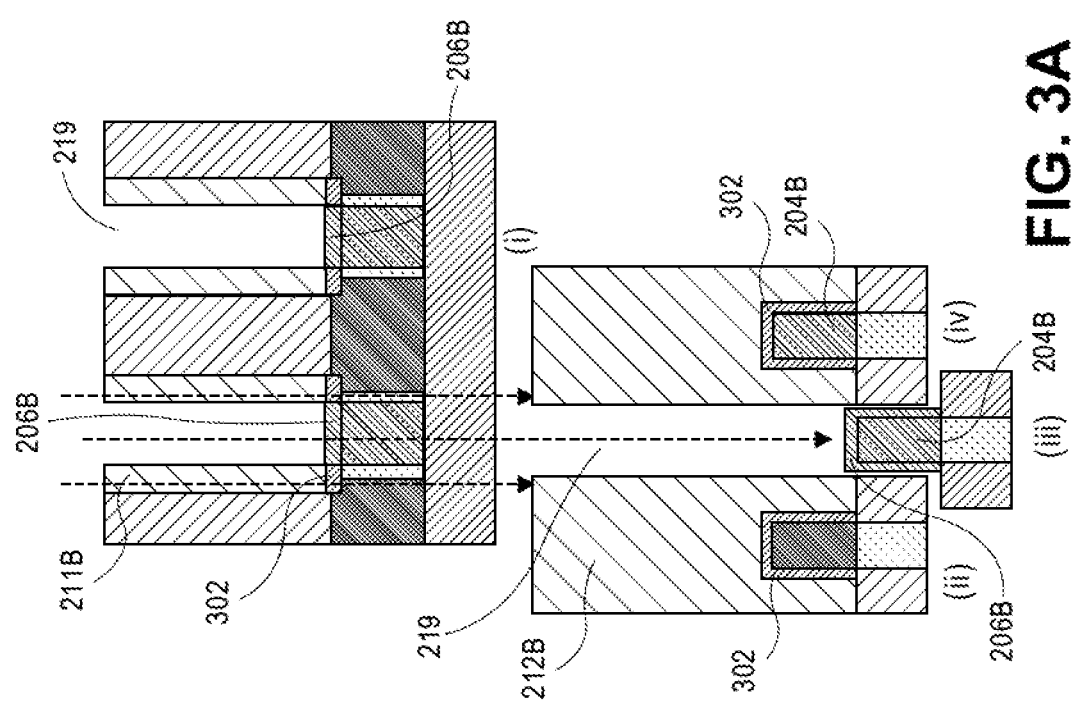

As an example of a process scheme involving replacement of a dummy gate oxide layer with solid by-products, FIGS. 3A-3B illustrate cross-sectional views representing various operations in another method of fabricating a non-planar integrated circuit structure having mitigated source or drain etch from replacement gate process, in accordance with another embodiment of the present disclosure.

In an embodiment, with reference again to FIG. 2D, the spacer layer 211A is instead retained as the final spacer. However, subsequent to forming recessed dummy gate oxide 206B, a protective layer is formed in the open regions beneath spacer layer 211A. Further processing such as described in association with FIGS. 2G-2I may then be performed with the protective layer in place.

Referring to FIG. 3A, structure (ii) shows a cross-sectional view taken through a location of the left arrow through structure (i), structure (iii) shows a cross-sectional view taken through a location of the middle arrow through structure (i), and structure (iv) shows a cross-sectional view taken through a location of the right arrow through structure (i). FIG. 3A effectively represents the structure of FIG. 1G but with a protective layer 302 in openings 122, or the structure of FIG. 2J but with protective layer 302 beneath spacers 212B. In FIG. 3A, in accordance with an embodiment, gate spacers are designated as 211B since they were fabricated from spacer layer 211A.

In an embodiment, protective layer 302 is a material such as a carbon-doped nitride or other etch resistant material. In another embodiment, protective layer 302 is formed by modifying (instead of recessing) a portion of the dummy gate oxide exposed at the outsides of the spacer precursor 211A, e.g., by doping with carbon.

Referring to FIG. 3B, the recessed dummy gate oxide 206B of FIG. 3A is removed. In accordance with an embodiment of the present disclosure, and in contrast to FIG. 1G, removal of the recessed dummy gate oxide 206B does not form openings or pathways beneath the gate spacers 211B to the epitaxial source or drain structures 218 because the protective layer is resistant to the etch used to remove the recessed dummy gate oxide 206B. Accordingly, in an embodiment, the processing used to remove the recessed dummy gate oxide 206B does not access the epitaxial source or drain structures 218. Additionally, in an embodiment, subsequent processing performed through trenches 219, such as channel shaping or nanowire release prior to permanent gate stack formation in trenches 219, does not access the epitaxial source or drain structures 218 beneath the gate spacers 212B. It is to be appreciated that following such removal of recessed dummy gate oxide 206B or such channel shaping or nanowire release, a permanent gate dielectric and a permanent gate electrode may be formed in trenches 219.

In accordance with an embodiment of the present disclosure, with reference to FIG. 3B and to subsequent permanent gate stack formation in trenches 219 describe above, an integrated circuit structure includes a fin 204B or a nanowire (e.g., such as a nanowire released from fin 204B, examples of which are described in greater detail below). In one embodiment, the fin or nanowire is composed of silicon. A gate stack is over the fin 204B or around the nanowire, the gate stack including a gate dielectric and a gate electrode (e.g., as subsequently formed in trench 219). A first dielectric spacer 211B is along a first side of the gate stack, and a second dielectric spacer 211B is along a second side of the gate stack. The first and second dielectric spacers 211B are over at least a portion of the fin 204B or nanowire. An insulating material 302 is vertically between and in contact with the portion of the fin 204B or nanowire and the first and second dielectric spacers 211B. A first epitaxial source or drain structure 218 is at the first side of the gate stack, and a second epitaxial source or drain structure 218 is at the second side of the gate stack.

In an embodiment, a portion of each of the first and second epitaxial source or drain structures 218 is beneath a respective one of the first and second dielectric spacers 211B, e.g., the first and second epitaxial source or drain structures 218 are "embedded" first and second epitaxial source or drain structures 218. In another embodiment, no portion of each of the first and second epitaxial source or drain structures 218 is beneath a respective one of the first and second dielectric spacers 211B. In an embodiment, the insulating material 302 is in contact with the first and second epitaxial source or drain structures 218, as is depicted.

In an embodiment, the insulating material 302 is composed of a same material as the first and second dielectric spacers 211B. In another embodiment, the insulating material 302 is composed of a different material than the first and second dielectric spacers 211B.

In an embodiment, the insulating material 302 includes silicon, nitrogen and carbon, such as, e.g., in a layer of carbon-doped silicon nitride. In another embodiment, the insulating material 302 includes silicon, oxygen and carbon, such as, e.g., in a layer of carbon-doped silicon oxide.

As described above, nanowire release processing may be performed through a replacement gate trench. Examples of such release processes are described below. Additionally, in another aspect, backend (BE) interconnect scaling can result in lower performance and higher manufacturing cost due to patterning complexity. Embodiments described herein may be implemented to enable front and backside interconnect integration for nanowire transistors. Embodiments described herein may provide an approach to achieve a relatively wider interconnect pitch. The result may be improved product performance and lower patterning costs. Embodiments may be implemented to enable robust functionality of scaled nanowire or nanoribbon transistors with low power and high performance.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors which are partially filled with SD epitaxy. A remainder of the opening is filled with a conductive material. Deep trench formation on one of the source or drain side enables direct contact to a backside interconnect level.

In an exemplary process flow, FIGS. 4A-4J illustrates cross-sectional views of various operations in a method of fabricating a gate-all-around integrated circuit structure, in accordance with an embodiment of the present disclosure.

Figure 4A:
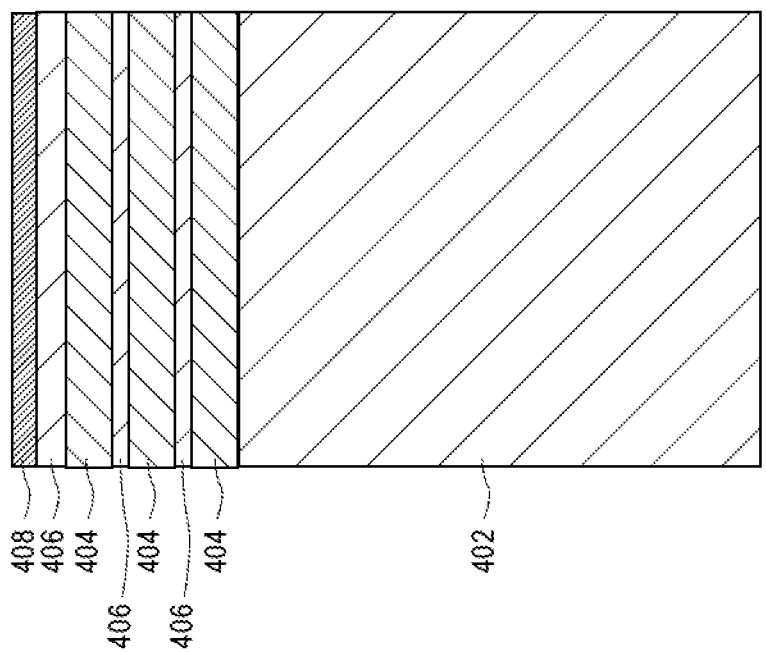
FIGS. 4A-4J illustrates cross-sectional views of various operations in a method of fabricating a gate-all-around integrated circuit structure, in accordance with an embodiment of the present disclosure.

Referring to FIG. 4A, a method of fabricating an integrated circuit structure includes forming a starting stack 400 which includes alternating silicon germanium layer 404 and silicon layers 406 above a fin 402, such as a silicon fin. The silicon layers 406 may be referred to as a vertical arrangement of silicon nanowires. A protective cap 408 may be formed above the alternating silicon germanium layer 404 and silicon layers 406, as is depicted.

Figure 4B:
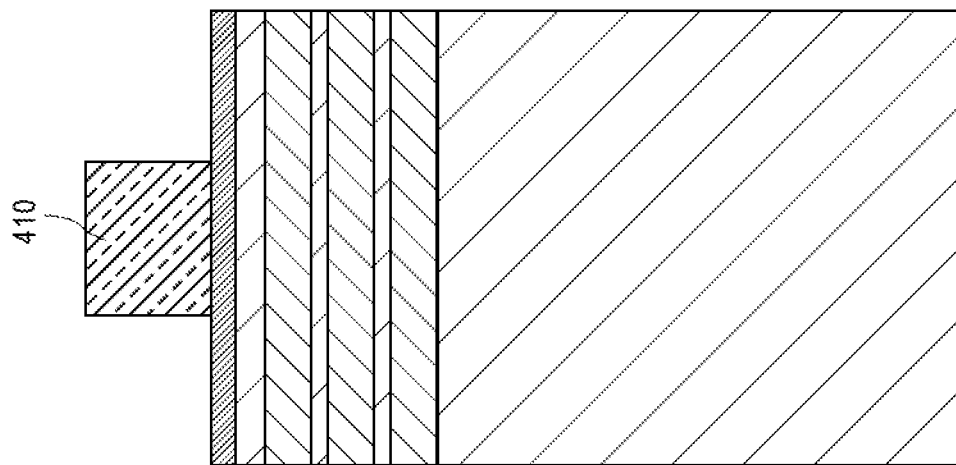

Referring to FIG. 4B, a gate stack 410 is formed over the vertical arrangement of nanowires 406. Portions of the vertical arrangement of nanowires 406 are then released by removing portions of the silicon germanium layer 404 to provide recessed silicon germanium layers 404' and cavities 412, as is depicted in FIG. 4C.

It is to be appreciated that the structure of FIG. 4C may be fabricated to completion without first performing the deep etch and asymmetric contact processing described below. In either case (e.g., with or without asymmetric contact processing), in an embodiment, a fabrication process involves use of a process scheme that provides mitigated source or drain etch from a replacement gate process, examples of which are described above in association with FIGS. 2A-2K and FIGS. 3A-3B.

Figure 4D:
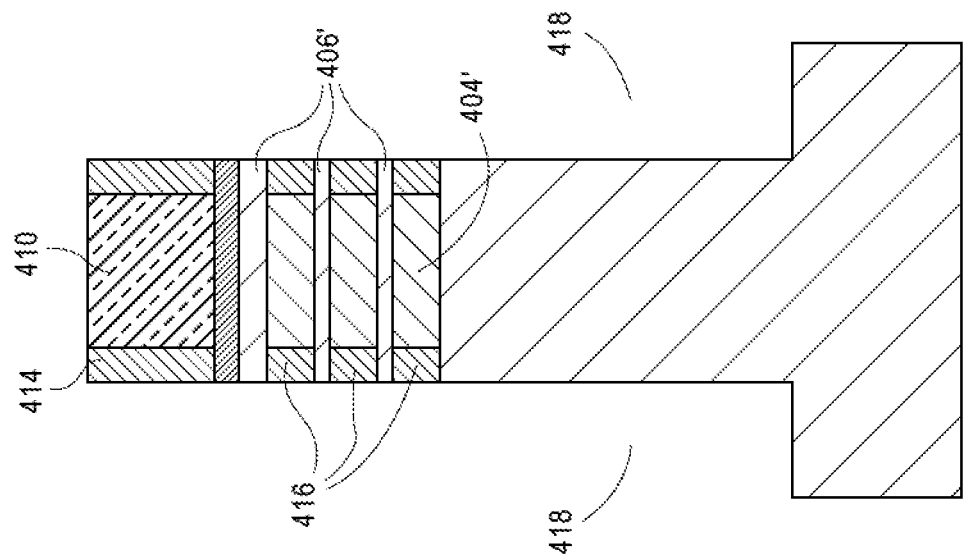
Figure 4C:
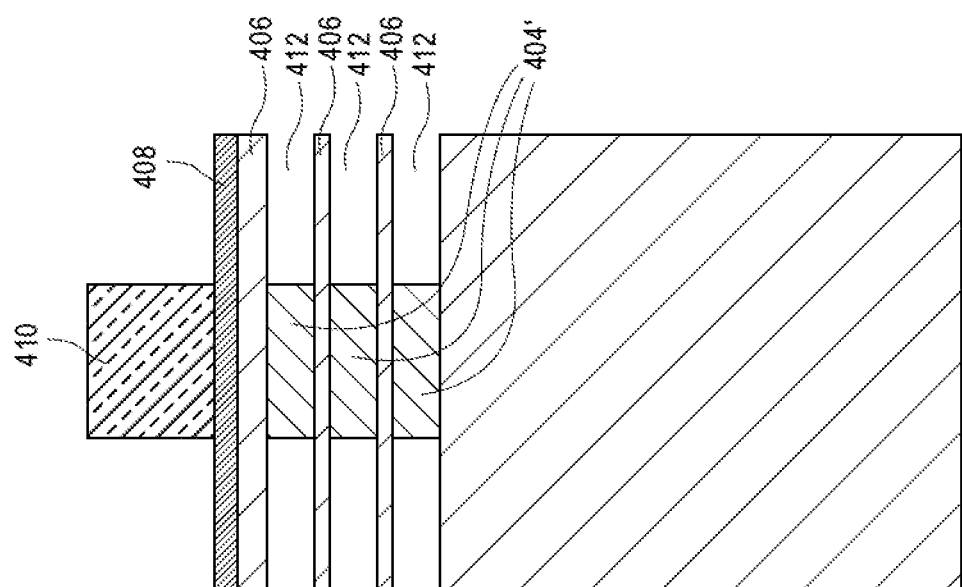
Figure 4G:
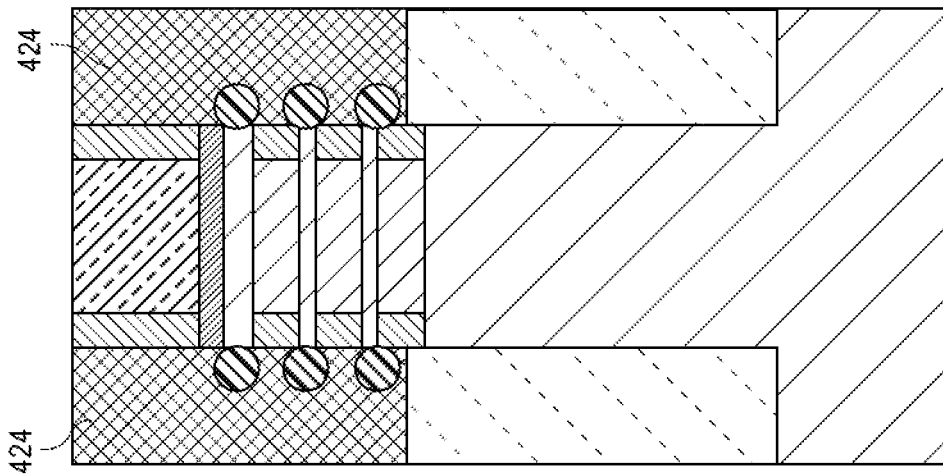

Referring to FIG. 4D, upper gate spacers 414 are formed at sidewalls of the gate structure 410. Cavity spacers 416 are formed in the cavities 412 beneath the upper gate spacers 414. A deep trench contact etch is then performed to form trenches 418 and to formed recessed nanowires 406'. A sacrificial material 420 is then formed in the trenches 418, as is depicted in FIG. 4E.

Figure 4F:
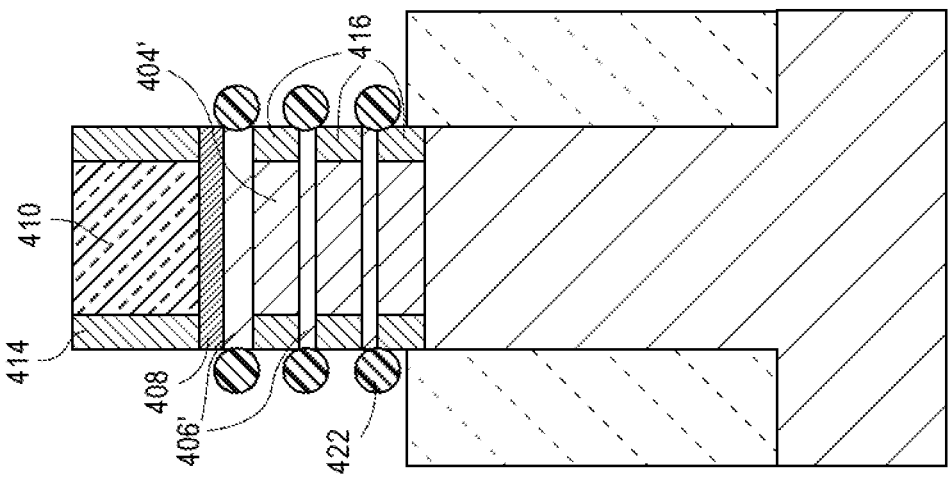
Figure 4E:
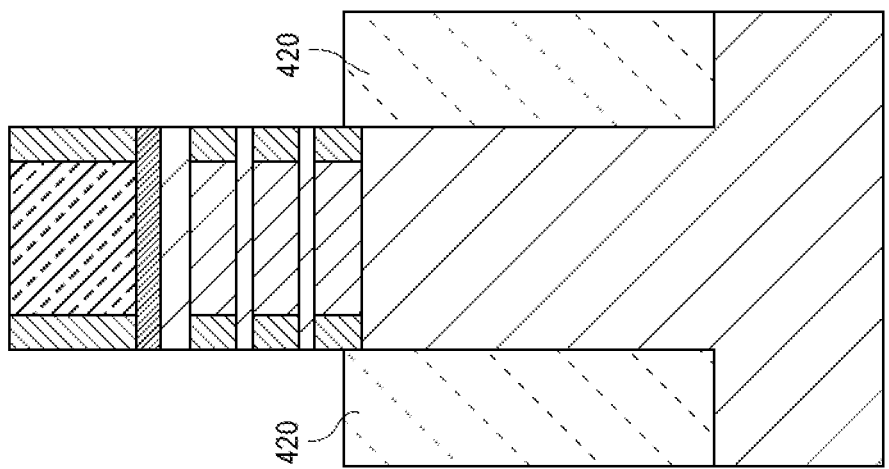

Referring to FIG. 4F, a first epitaxial source or drain structure (e.g., left-hand features 422) is formed at a first end of the vertical arrangement of nanowires 406'. A second epitaxial source or drain structure (e.g., right-hand features 422) is formed at a second end of the vertical arrangement of nanowires 406'. An inter-layer dielectric (ILD) material 424 is then formed at the sides of the gate electrode 410 and adjacent the source or drain structures 422, as is depicted in FIG. 4G.

Figure 4J:
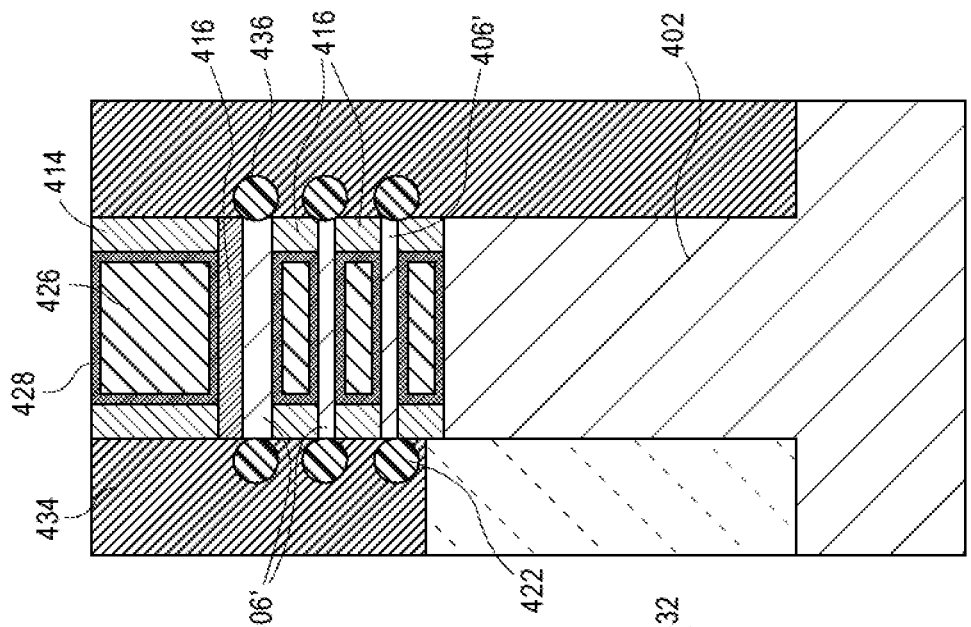
Figure 4I:
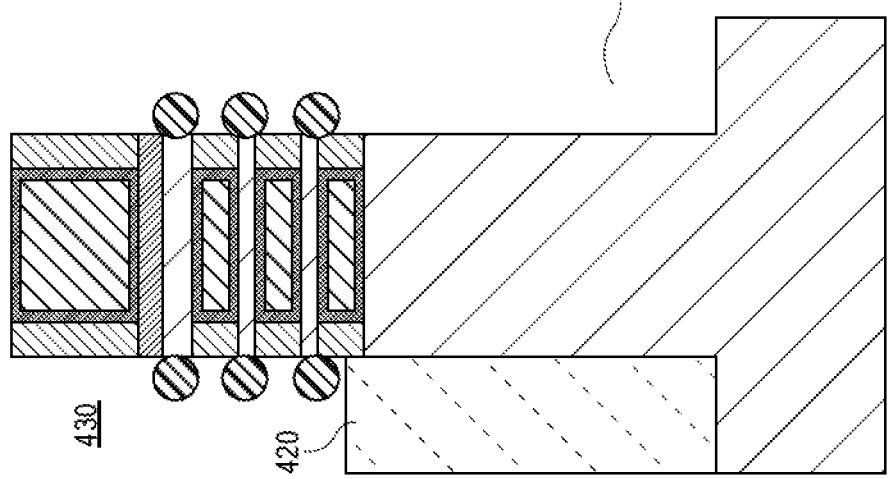
Figure 4H:
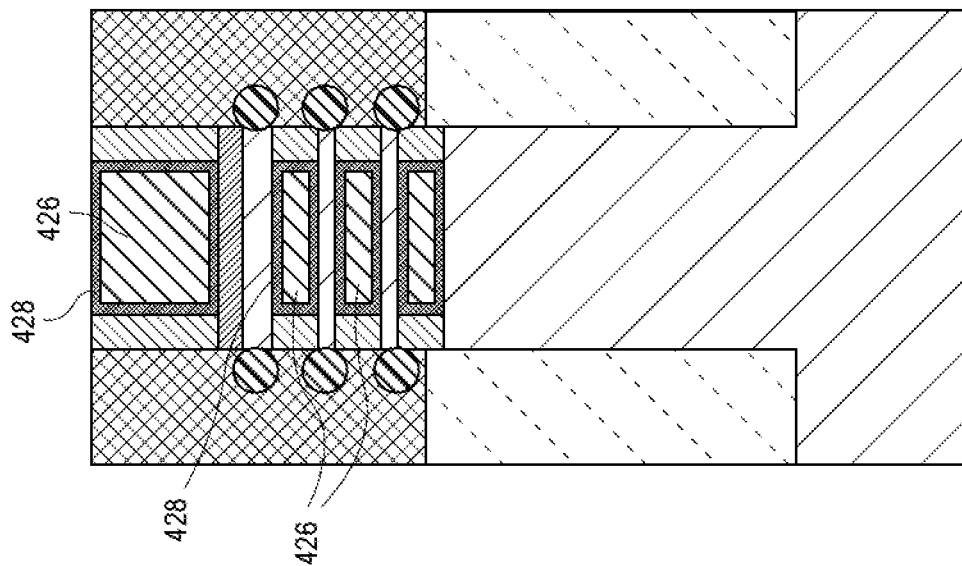

Referring to FIG. 4H, a replacement gate process is used to form a permanent gate dielectric 428 and a permanent gate electrode 426. In an embodiment, a fabrication process involves use of a process scheme that provides mitigated source or drain etch from a replacement gate process, examples of which are described above in association with FIGS. 2A-2K and FIGS. 3A-3B.

Referring to FIG. 4I, the ILD material 424 is then removed. The sacrificial material 420 is then removed from one of the source drain locations (e.g., right-hand side) to form trench 432, but is not removed from the other of the source drain locations to form trench 430.

Referring to FIG. 4J, a first conductive contact structure 434 is formed coupled to the first epitaxial source or drain structure (e.g., left-hand features 422). A second conductive contact structure 436 is formed coupled to the second epitaxial source or drain structure (e.g., right-hand features 422). The second conductive contact structure 436 is formed deeper along the fin 402 than the first conductive contact structure 434. In an embodiment, although not depicted in FIG. 4J, the method further includes forming an exposed surface of the second conductive contact structure 436 at a bottom of the fin 402.

In an embodiment, the second conductive contact structure 436 is deeper along the fin 402 than the first conductive contact structure 434, as is depicted. In an embodiment, the second conductive contact structure 436 is deeper along the fin 402 than the first conductive contact structure 434, as is depicted. In one such embodiment, the first conductive contact structure 434 is not along the fin 402, as is depicted. In another such embodiment, not depicted, the first conductive contact structure 434 is partially along the fin 402.

In an embodiment, the second conductive contact structure 434 is along an entirety of the fin 402. In an embodiment, although not depicted, in the case that the bottom of the fin 402 is exposed by a backside substrate removal process, the second conductive contact structure 434 has an exposed surface at a bottom of the fin 402.

In another aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back side, and again employed in back-side fabrication. Processing of both a front side and revealed back side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 µm in thickness, 100-700 µm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate:intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CHIP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed backside of the device layer or specific device regions there in. In some embodiments, the backside device layer processing includes a further polish or wet/dry etch through a thickness of the device layer disposed between the intervening layer and a device region previously fabricated in the device layer, such as a source or drain region.

In some embodiments where the carrier layer, intervening layer, or device layer backside is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back side of an intervening layer, a back side of the device layer, and/or back side of one or more semiconductor regions within the device layer, and/or front-side metallization revealed. Additional backside processing of any of these revealed regions may then be performed during downstream processing.

It is to be appreciated that the structures resulting from the above exemplary processing schemes may be used in a same or similar form for subsequent processing operations to complete device fabrication, such as PMOS and/or NMOS device fabrication. As an example of a completed device, FIG. 5 illustrate a cross-sectional view of a non-planar integrated circuit structure as taken along a gate line, in accordance with an embodiment of the present disclosure.

Figure 5:
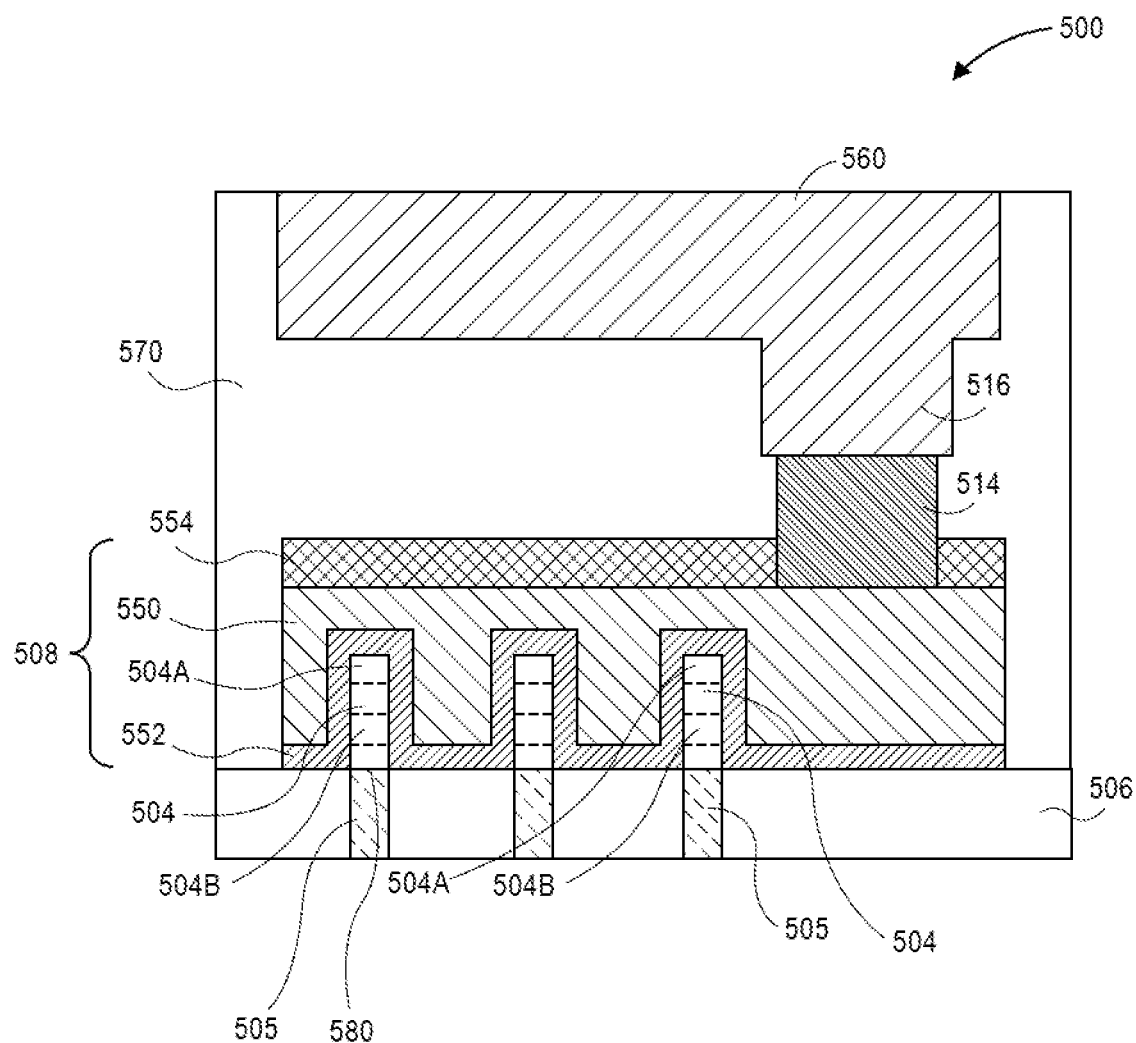
FIG. 5 illustrates a cross-sectional view of a non-planar integrated circuit structure as taken along a gate line, in accordance with an embodiment of the present disclosure.

Referring to FIG. 5, a semiconductor structure or device 500 includes a non-planar active region (e.g., a fin structure including protruding fin portion 504 and sub-fin region 505) within a trench isolation region 506. In an embodiment, instead of a solid fin, the non-planar active region is separated into nanowires (such as nanowires 504A and 504B) above sub-fin region 505, as is represented by the dashed lines. In either case, for ease of description for non-planar integrated circuit structure 500, a non-planar active region 504 is referenced below as a protruding fin portion.

A gate line 508 is disposed over the protruding portions 504 of the non-planar active region (including, if applicable, surrounding nanowires 504A and 504B), as well as over a portion of the trench isolation region 506. As shown, gate line 508 includes a gate electrode 550 and a gate dielectric layer 552. In one embodiment, gate line 508 may also include a dielectric cap layer 554. A gate contact 514, and overlying gate contact via 516 are also seen from this perspective, along with an overlying metal interconnect 560, all of which are disposed in inter-layer dielectric stacks or layers 570. Also seen from the perspective of FIG. 5, the gate contact 514 is, in one embodiment, disposed over trench isolation region 506, but not over the non-planar active regions.

In an embodiment, the semiconductor structure or device 500 is a non-planar device such as, but not limited to, a fin-FET device, a tri-gate device, a nano-ribbon device, or a nano-wire device. In such an embodiment, a corresponding semiconducting channel region is composed of or is formed in a three-dimensional body. In one such embodiment, the gate electrode stacks of gate lines 508 surround at least a top surface and a pair of sidewalls of the three-dimensional body.

As is also depicted in FIG. 5, in an embodiment, an interface 580 exists between a protruding fin portion 504 and sub-fin region 505. The interface 580 can be a transition region between a doped sub-fin region 505 and a lightly or undoped upper fin portion 504. In one such embodiment, each fin is approximately 10 nanometers wide or less, and sub-fin dopants are supplied from an adjacent solid state doping layer at the sub-fin location. In a particular such embodiment, each fin is less than 10 nanometers wide.

Although not depicted in FIG. 5, it is to be appreciated that source or drain regions of or adjacent to the protruding fin portions 504 are on either side of the gate line 508, i.e., into and out of the page. In one embodiment, the source or drain regions are doped portions of original material of the protruding fin portions 504. In another embodiment, the material of the protruding fin portions 504 is removed and replaced with another semiconductor material, e.g., by epitaxial deposition to form discrete epitaxial nubs or non-discrete epitaxial structures. In either embodiment, the source or drain regions may extend below the height of dielectric layer of trench isolation region 506, i.e., into the sub-fin region 505. In accordance with an embodiment of the present disclosure, the more heavily doped sub-fin regions, i.e., the doped portions of the fins below interface 580, inhibits source to drain leakage through this portion of the bulk semiconductor fins. In an embodiment, the source and drain structures are N-type epitaxial source and drain structures, both including phosphorous dopant impurity atoms. In accordance with one or more embodiments of the present disclosure, the source and drain regions have associated asymmetric source and drain contact structures, as described above in association with FIG. 4J.

With reference again to FIG. 5, in an embodiment, fins 504/505 (and, possibly nanowires 504A and 504B) are composed of a crystalline silicon, silicon/germanium or germanium layer doped with a charge carrier, such as but not limited to phosphorus, arsenic, boron or a combination thereof. In one embodiment, the concentration of silicon atoms is greater than 97%. In another embodiment, fins 504/505 are composed of a group III-V material, such as, but not limited to, gallium nitride, gallium phosphide, gallium arsenide, indium phosphide, indium antimonide, indium gallium arsenide, aluminum gallium arsenide, indium gallium phosphide, or a combination thereof. Trench isolation region 506 may be composed of a dielectric material such as, but not limited to, silicon dioxide, silicon oxy-nitride, silicon nitride, or carbon-doped silicon nitride.

Gate line 508 may be composed of a gate electrode stack which includes a gate dielectric layer 552 and a gate electrode layer 550. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate fin 504. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 514 and overlying gate contact via 516 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 508 is formed while eliminating the use of a lithographic step with exceedingly tight registration budget. In an embodiment, the contact pattern is a vertically asymmetric contact pattern, such as described in association with FIG. 4J. In other embodiments, all contacts are front side connected and are not asymmetric. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 500 involves fabrication of the gate stack structure 508 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous NH$_4$OH or tetramethylammonium hydroxide. In one embodiment, dummy gates are composed of silicon nitride and are removed with a wet etch including aqueous phosphoric acid. In an embodiment, a fabrication process involves use of a process scheme that provides mitigated source or drain etch from a replacement gate process, examples of which are described above in association with FIGS. 2A-2K and FIGS. 3A-3B.

Referring again to FIG. 5, the arrangement of semiconductor structure or device 500 places the gate contact over isolation regions. Such an arrangement may be viewed as inefficient use of layout space. In another embodiment, however, a semiconductor device has contact structures that contact portions of a gate electrode formed over an active region, e.g., over a fin 505, and in a same layer as a trench contact via.

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide (SiO$_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed) or formed by vertical merging (e.g., epitaxial regions are formed around existing wires), as described in greater detail below in association with FIGS. 9A-9E.

To provide further context, advantages of a self-aligned gate endcap (SAGE) architecture may include the enabling of higher layout density and, in particular, scaling of diffusion to diffusion spacing. To provide illustrative comparison, FIG. 6 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Figure 6:
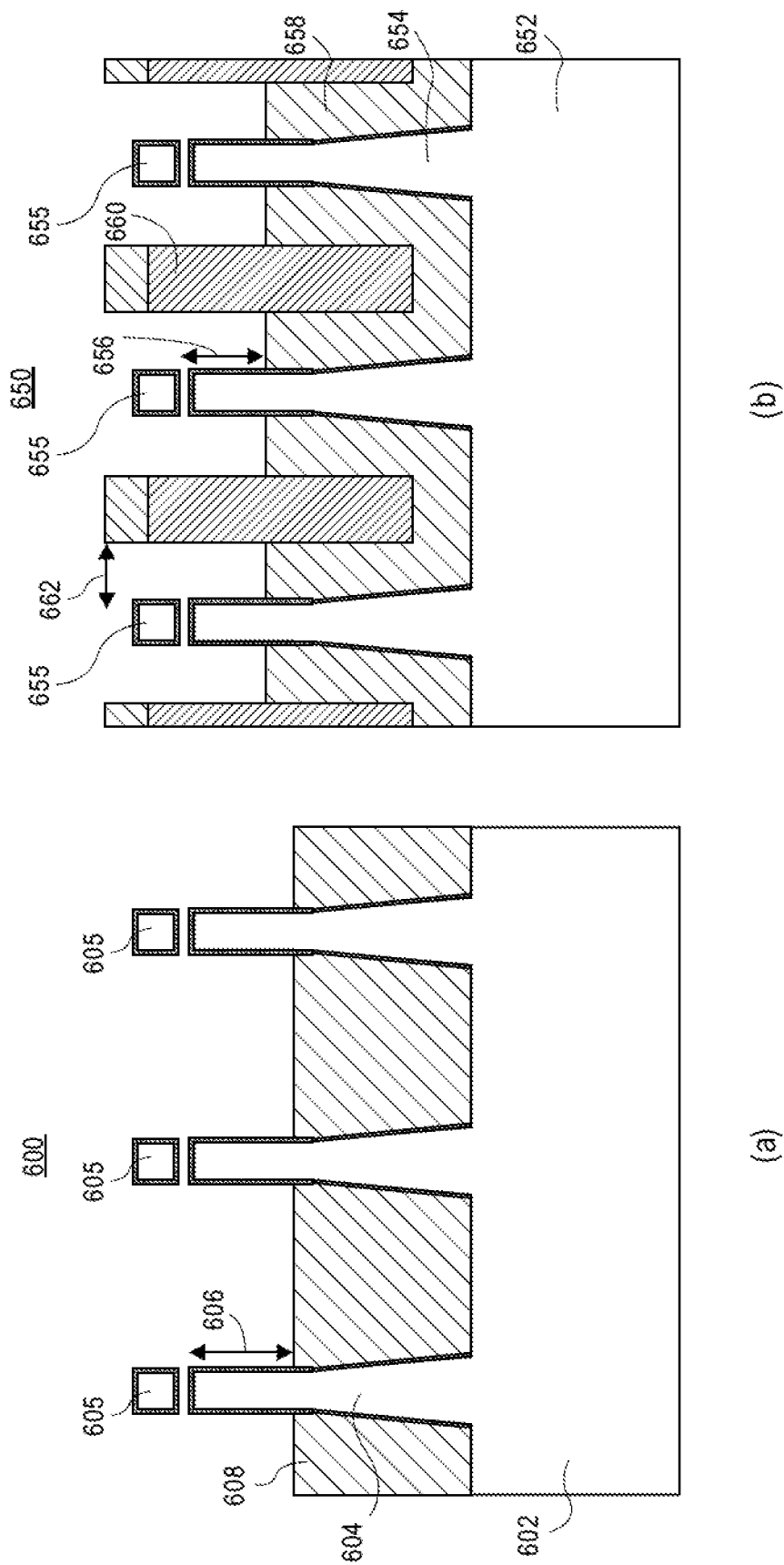
FIG. 6 illustrates cross-sectional views taken through nanowires and fins for a non-endcap architecture (left-hand side(a)) versus a self-aligned gate endcap (SAGE) architecture (right-hand side(b)), in accordance with an embodiment of the present disclosure.

Referring to the left-hand side of FIG. 6, an integrated circuit structure 600 includes a substrate 602 having fins 604 protruding therefrom by an amount 606 above an isolation structure 608 laterally surrounding lower portions of the fins 604. Corresponding nanowires 605 are over the fins 604. A gate structure may be formed over the integrated circuit structure 600 to fabricate a device. However, breaks in such a gate structure may be accommodated for by increasing the spacing between fin 604/nanowire 605 pairs.

By contrast, referring to the right-hand side of FIG. 6, an integrated circuit structure 650 includes a substrate 652 having fins 654 protruding therefrom by an amount 656 above an isolation structure 658 laterally surrounding lower portions of the fins 604. Corresponding nanowires 605 are over the fins 604. Isolating SAGE walls 660 (which may include a hardmask thereon, as depicted) are included within the isolation structure 652 and between adjacent fin 654/ nanowire 655 pairs. The distance between an isolating SAGE wall 660 and a nearest fin 654/nanowire 655 pair defines the gate endcap spacing 662. A gate structure may be formed over the integrated circuit structure 600, between insolating SAGE walls to fabricate a device. Breaks in such a gate structure are imposed by the isolating SAGE walls. Since the isolating SAGE walls 660 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 660. In an embodiment, as depicted, the SAGE walls 660 each include a lower dielectric portion and a dielectric cap on the lower dielectric portion.

In accordance with an embodiment of the present disclosure, a fabrication process involves use of a process scheme that provides mitigated source or drain etch from a replacement gate process, examples of which are described above in association with FIGS. 2A-2K and FIGS. 3A-3B.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

Figure 7:
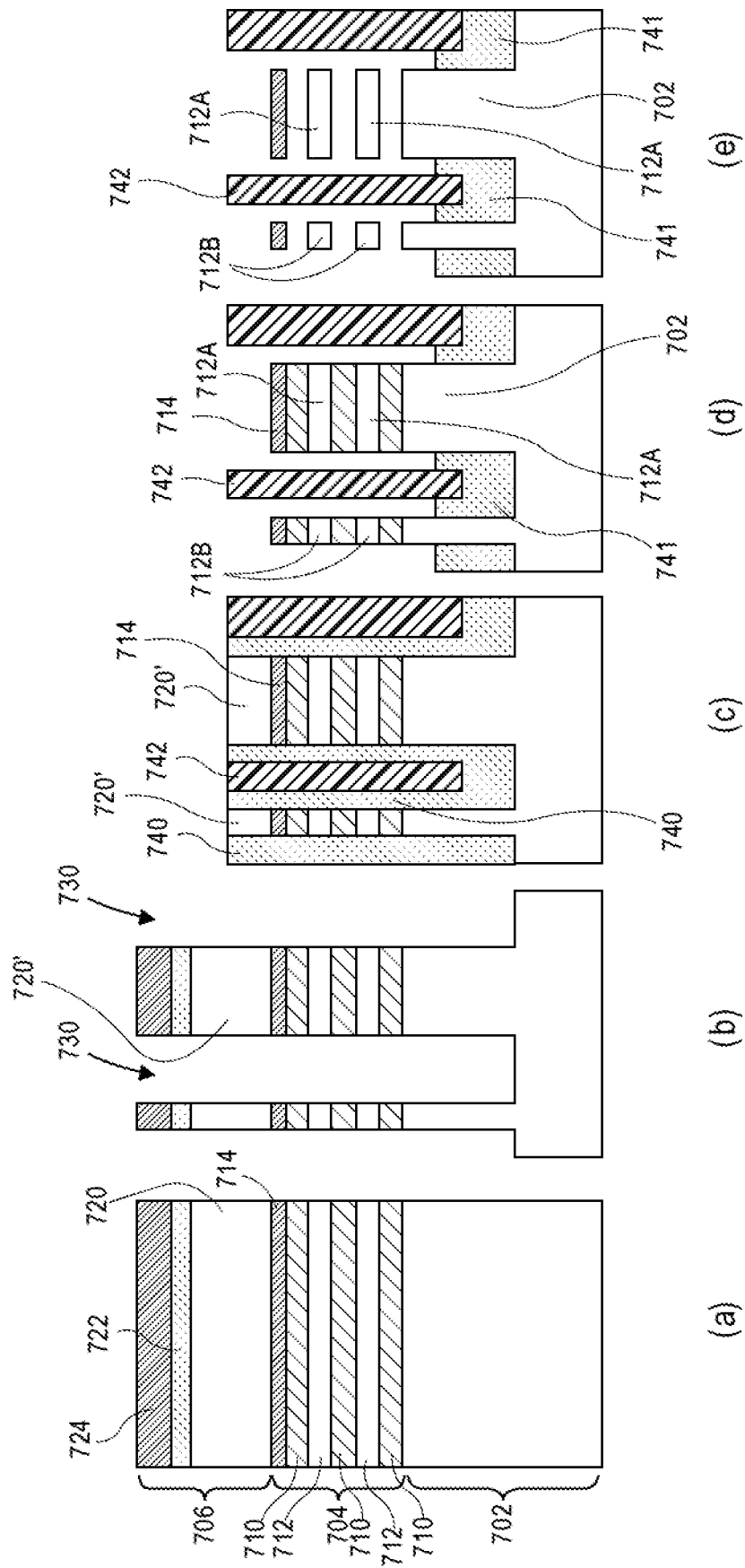
FIG. 7 illustrate cross-sectional views representing various operations in a method of fabricating a self-aligned gate endcap (SAGE) structure with gate-all-around devices, in accordance with an embodiment of the present disclosure.

In an exemplary processing scheme for structures having SAGE walls separating neighboring devices, FIG. 7 illustrate cross-sectional views representing various operations in a method of fabricating a self-aligned gate endcap (SAGE) structure with gate-all-around devices, in accordance with an embodiment of the present disclosure.

Referring to part (a) of FIG. 7, a starting structure includes a nanowire patterning stack 704 above a substrate 702. A lithographic patterning stack 706 is formed above the nanowire patterning stack 704. The nanowire patterning stack 704 includes alternating silicon germanium layers 710 and silicon layers 712. A protective mask 714 is between the nanowire patterning stack 704 and the lithographic patterning stack 706. In one embodiment, the lithographic patterning stack 706 is trilayer mask composed of a topographic masking portion 720, an anti-reflective coating (ARC) layer 722, and a photoresist layer 724. In a particular such embodiment, the topographic masking portion 720 is a carbon hardmask (CHM) layer and the anti-reflective coating layer 722 is a silicon ARC layer.

Referring to part (b) of FIG. 7, the stack of part (a) is lithographically patterned and then etched to provide an etched structure including a patterned substrate 702 and trenches 730.

Referring to part (c) of FIG. 7, the structure of part (b) has an isolation layer 740 and a SAGE material 742 formed in trenches 730. The structure is then planarized to leave patterned topographic masking layer 720' as an exposed upper layer.

Referring to part (d) of FIG. 7, the isolation layer 740 is recessed below an upper surface of the patterned substrate 702, e.g., to define a protruding fin portion and to provide a trench isolation structure 741 beneath SAGE walls 742.

Referring to part (e) of FIG. 7, the silicon germanium layers 710 are removed at least in the channel region to release silicon nanowires 712A and 712B. Subsequent to the formation of the structure of part (e) of FIG. 7, a gate stacks may be formed around nanowires 712B or 712A, over protruding fins of substrate 702, and between SAGE walls 742. In one embodiment, prior to formation of the gate stacks, the remaining portion of protective mask 714 is removed. In another embodiment, the remaining portion of protective mask 714 is retained as an insulating fin hat as an artifact of the processing scheme.

Referring again to part (e) of FIG. 7, it is to be appreciated that a channel view is depicted, with source or drain regions being locating into and out of the page. In an embodiment, the channel region including nanowires 712B has a width less than the channel region including nanowires 712A. Thus, in an embodiment, an integrated circuit structure includes multiple width (multi-Wsi) nanowires. Although structures of 712B and 712A may be differentiated as nanowires and nanoribbons, respectively, both such structures are typically referred to herein as nanowires. It is also to be appreciated that reference to or depiction of a fin/nanowire pair throughout may refer to a structure including a fin and one or more overlying nanowires (e.g., two overlying nanowires are shown in FIG. 7). In accordance with an embodiment of the present disclosure, a fabrication process involves use of a process scheme that provides mitigated source or drain etch from a replacement gate process, examples of which are described above in association with FIGS. 2A-2K and FIGS. 3A-3B.

To highlight an exemplary integrated circuit structure having three vertically arranged nanowires, FIG. 8A illustrates a three-dimensional cross-sectional view of a nanowire-based integrated circuit structure, in accordance with an embodiment of the present disclosure. FIG. 8B illustrates a cross-sectional source or drain view of the nanowire-based integrated circuit structure of FIG. 8A, as taken along the a-a' axis. FIG. 8C illustrates a cross-sectional channel view of the nanowire-based integrated circuit structure of FIG. 8A, as taken along the b-b' axis.

Referring to FIG. 8A, an integrated circuit structure 800 includes one or more vertically stacked nanowires (804 set) above a substrate 802. An optional fin between the bottom-most nanowire and the substrate 802 is not depicted for the sake of emphasizing the nanowire portion for illustrative purposes. Embodiments herein are targeted at both single wire devices and multiple wire devices. As an example, a three nanowire-based devices having nanowires 804A, 804B and 804C is shown for illustrative purposes. For convenience of description, nanowire 804A is used as an example where description is focused on one of the nanowires. It is to be appreciated that where attributes of one nanowire are described, embodiments based on a plurality of nanowires may have the same or essentially the same attributes for each of the nanowires.

Each of the nanowires 804 includes a channel region 806 in the nanowire. The channel region 806 has a length (L). Referring to FIG. 8C, the channel region also has a perimeter (Pc) orthogonal to the length (L). Referring to both FIGS. 8A and 8C, a gate electrode stack 808 surrounds the entire perimeter (Pc) of each of the channel regions 806. The gate electrode stack 808 includes a gate electrode along with a gate dielectric layer between the channel region 806 and the gate electrode (not shown). In an embodiment, the channel region is discrete in that it is completely surrounded by the gate electrode stack 808 without any intervening material such as underlying substrate material or overlying channel fabrication materials. Accordingly, in embodiments having a plurality of nanowires 804, the channel regions 806 of the nanowires are also discrete relative to one another.

Referring to both FIGS. 8A and 8B, integrated circuit structure 800 includes a pair of non-discrete source or drain regions 810/812. The pair of non-discrete source or drain regions 810/812 is on either side of the channel regions 806 of the plurality of vertically stacked nanowires 804. Furthermore, the pair of non-discrete source or drain regions 810/812 is adjoining for the channel regions 806 of the plurality of vertically stacked nanowires 804. In one such embodiment, not depicted, the pair of non-discrete source or drain regions 810/812 is directly vertically adjoining for the channel regions 806 in that epitaxial growth is on and between nanowire portions extending beyond the channel regions 806, where nanowire ends are shown within the source or drain structures. In another embodiment, as depicted in FIG. 8A, the pair of non-discrete source or drain regions 810/812 is indirectly vertically adjoining for the channel regions 806 in that they are formed at the ends of the nanowires and not between the nanowires.

In an embodiment, as depicted, the source or drain regions 810/812 are non-discrete in that there are not individual and discrete source or drain regions for each channel region 806 of a nanowire 804. Accordingly, in embodiments having a plurality of nanowires 804, the source or drain regions 810/812 of the nanowires are global or unified source or drain regions as opposed to discrete for each nanowire. In one embodiment, from a cross-sectional perspective orthogonal to the length of the discrete channel regions 806, each of the pair of non-discrete source or drain regions 810/812 is approximately rectangular in shape with a bottom tapered portion and a top vertex portion, as depicted in FIG. 8B. In other embodiments, however, the source or drain regions 810/812 of the nanowires are relatively larger yet discrete non-vertically merged epitaxial structures such as nubs described in association with FIGS. 4F-4J.

In accordance with an embodiment of the present disclosure, and as depicted in FIGS. 8A and 8B, integrated circuit structure 800 further includes a pair of contacts 814, each contact 814 on one of the pair of non-discrete source or drain regions 810/812. In one such embodiment, in a vertical sense, each contact 814 completely surrounds the respective non-discrete source or drain region 810/812. In another aspect, the entire perimeter of the non-discrete source or drain regions 810/812 may not be accessible for contact with contacts 814, and the contact 814 thus only partially surrounds the non-discrete source or drain regions 810/812, as depicted in FIG. 8B. In a contrasting embodiment, not depicted, the entire perimeter of the non-discrete source or drain regions 810/812, as taken along the a-a' axis, is surrounded by the contacts 814. In accordance with an embodiment of the present disclosure, although not depicted, the pair of contacts 814 is an asymmetric pair of contacts, as described in association with FIG. 4J.

Referring to FIGS. 8B and 8C, the non-discrete source or drain regions 810/812 are global in the sense that a single unified feature is used as a source or drain region for a plurality (in this case, 3) of nanowires 804 and, more particularly, for more than one discrete channel region 806. In an embodiment, the pair of non-discrete source or drain regions 810/812 is composed of a semiconductor material different than the semiconductor material of the discrete channel regions 806, e.g., the pair of non-discrete source or drain regions 810/812 is composed of a silicon germanium while the discrete channel regions 806 are composed of silicon. In another embodiment, the pair of non-discrete source or drain regions 810/812 is composed of a semiconductor material the same or essentially the same as the semiconductor material of the discrete channel regions 806, e.g., both the pair of non-discrete source or drain regions 810/812 and the discrete channel regions 806 are composed of silicon.

Referring again to FIG. 8A, in an embodiment, integrated circuit structure 800 further includes a pair of spacers 816. As is depicted, outer portions of the pair of spacers 816 may overlap portions of the non-discrete source or drain regions 810/812, providing for "embedded" portions of the non-discrete source or drain regions 810/812 beneath the pair of spacers 816. As is also depicted, the embedded portions of the non-discrete source or drain regions 810/812 may not extend beneath the entirety of the pair of spacers 816. In accordance with an embodiment of the present disclosure, a fabrication process involves use of a process scheme that provides mitigated source or drain etch from a replacement gate process, examples of which are described above in association with FIGS. 2A-2K and FIGS. 3A-3B.

Substrate 802 may be composed of a material suitable for integrated circuit structure fabrication. In one embodiment, substrate 802 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxynitride is on the lower bulk substrate. Thus, the structure 800 may be fabricated from a starting semiconductor-on-insulator substrate. Alternatively, the structure 800 is formed directly from a bulk substrate and local oxidation is used to form electrically insulative portions in place of the above described upper insulator layer. In another alternative embodiment, the structure 800 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 804 may be sized as wires or ribbons, as described below, and may have squared-off or rounder corners. In an embodiment, the nanowires 804 are composed of a material such as, but not limited to, silicon, germanium, or a combination thereof. In one such embodiment, the nanowires are single-crystalline. For example, for a silicon nanowire 804, a single-crystalline nanowire may be based from a (100) global orientation, e.g., with a <100> plane in the z-direction. As described below, other orientations may also be considered. In an embodiment, the dimensions of the nanowires 804, from a cross-sectional perspective, are on the nano-scale. For example, in a specific embodiment, the smallest dimension of the nanowires 804 is less than approximately 20 nanometers. In an embodiment, the nanowires 804 are composed of a strained material, particularly in the channel regions 806.

Referring to FIGS. 8C, in an embodiment, each of the channel regions 806 has a width (Wc) and a height (Hc), the width (Wc) approximately the same as the height (Hc). That is, in both cases, the channel regions 806 are square-like or, if corner-rounded, circle-like in cross-section profile. In another aspect, the width and height of the channel region need not be the same, such as the case for nanoribbbons as described throughout.

In another aspect, methods of fabricating a nanowire portion of a fin/nanowire integrated circuit structure are provided. For example, FIGS. 9A-9E illustrate three-dimensional cross-sectional views representing various operations in a method of fabricating a nanowire portion of a fin/nanowire structure, in accordance with an embodiment of the present disclosure.

Figure 9A:
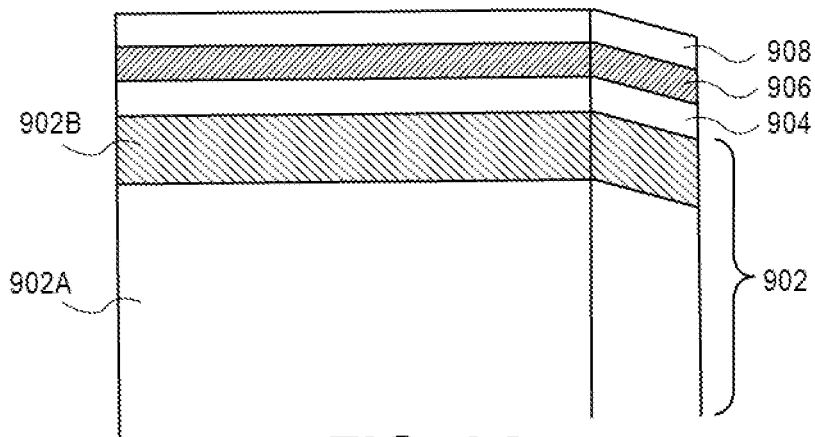
FIGS. 9A-9E illustrate three-dimensional cross-sectional views representing various operations in a method of fabricating a nanowire portion of a fin/nanowire structure, in accordance with an embodiment of the present disclosure.

A method of fabricating a nanowire integrated circuit structure may include forming a nanowire above a substrate. In a specific example showing the formation of two silicon nanowires, FIG. 9A illustrates a substrate 902 (e.g., composed of a bulk substrate silicon substrate 902A with an insulating silicon dioxide layer 902B there on) having a silicon layer 904/silicon germanium layer 906/silicon layer 908 stack thereon. It is to be understood that, in another embodiment, a silicon germanium layer/silicon layer/silicon germanium layer stack may be used to ultimately form two silicon germanium nanowires.

Figure 9B:
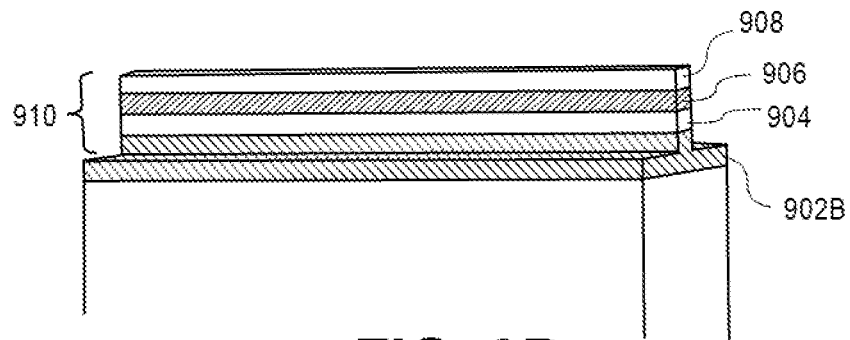

Referring to FIG. 9B, a portion of the silicon layer 904/silicon germanium layer 906/silicon layer 908 stack as well as a top portion of the silicon dioxide layer 902B is patterned into a fin-type structure 910, e.g., with a mask and plasma etch process. It is to be appreciated that, for illustrative purposes, the etch for FIG. 9B is shown as forming two silicon nanowire precursor portions. Although the etch is shown for ease of illustration as ending within a bottom isolation layer, more complex stacks are contemplated within the context of embodiments of the present disclosure. For example, the process may be applied to a nanowire/fin stack as described in association with FIG. 7.

Figure 9C:
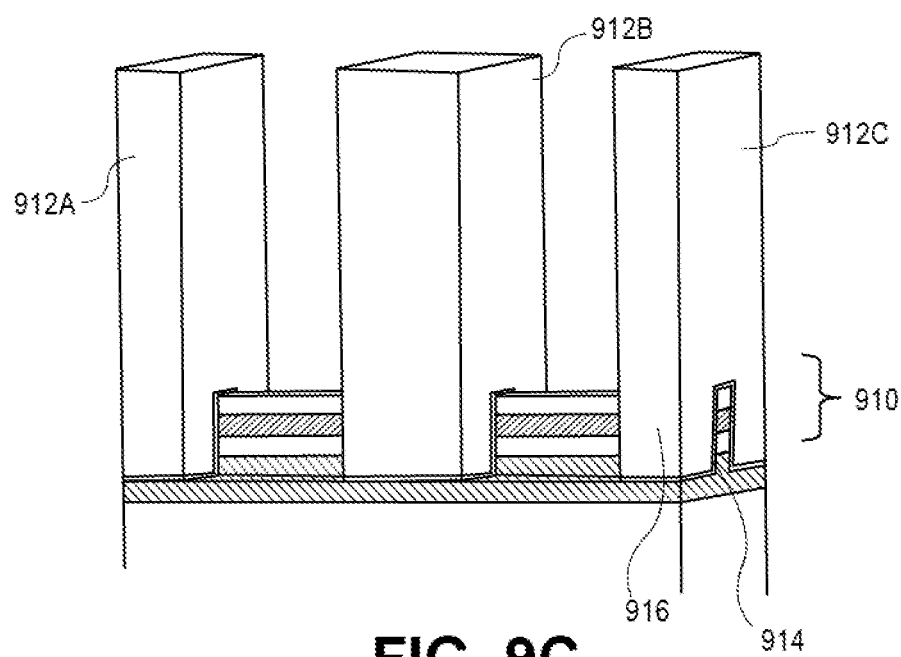

The method may also include forming a channel region in the nanowire, the channel region having a length and a perimeter orthogonal to the length. In a specific example showing the formation of three gate structures over the two silicon nanowires, FIG. 9C illustrates the fin-type structure 910 with three sacrificial gates 912A, 912B, and 912C thereon. In one such embodiment, the three sacrificial gates 912A, 912B, and 912C are composed of a sacrificial gate oxide layer 914 and a sacrificial polysilicon gate layer 916 which are blanket deposited and patterned with a plasma etch process.

Figure 9D:
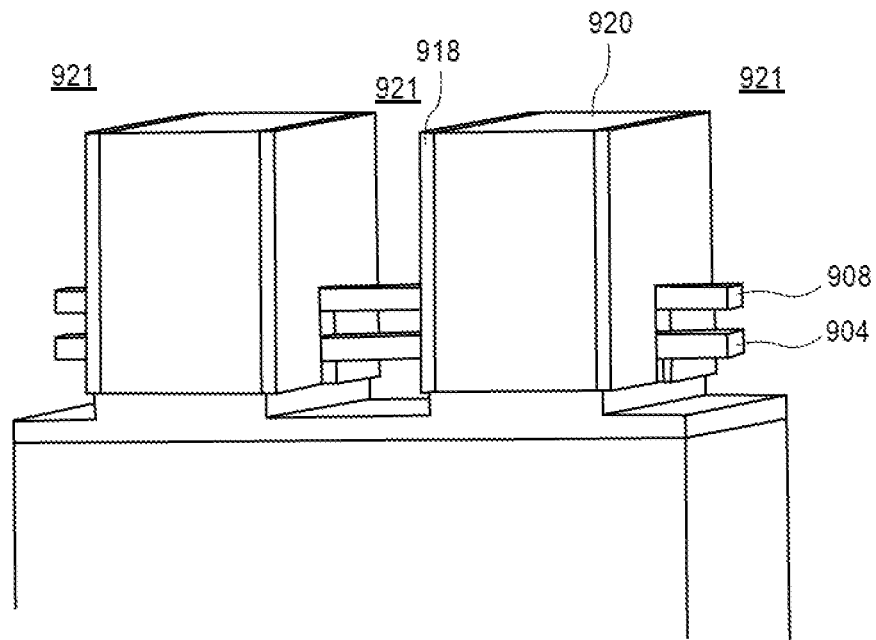

Following patterning to form the three sacrificial gates 912A, 912B, and 912C, spacers may be formed on the sidewalls of the three sacrificial gates 912A, 912B, and 912C, doping may be performed (e.g., tip and/or source and drain type doping), and an interlayer dielectric layer may be formed to cover the three sacrificial gates 912A, 912B, and 912C. The interlayer dielectric layer may be polished to expose the three sacrificial gates 912A, 912B, and 912C for a replacement gate, or gate-last, process. Referring to FIG. 9D, the three sacrificial gates 912A, 912B, and 912C have been removed, leaving spacers 918 and a portion of the interlayer dielectric layer 920 remaining. In accordance with an embodiment of the present disclosure, a fabrication process involves use of a process scheme that provides mitigated source or drain etch from a replacement gate process, examples of which are described above in association with FIGS. 2A-2K and FIGS. 3A-3B.

Additionally, referring again to FIG. 9D the portions of the silicon germanium layer 906 and the portion of the insulating silicon dioxide layer 902B of the fin structure 910 are removed in the regions originally covered by the three sacrificial gates 912A, 912B, and 912C. Discrete portions of the silicon layers 904 and 908 thus remain, as depicted in FIG. 9D.

The discrete portions of the silicon layers 904 and 908 shown in FIG. 9D will, in one embodiment, ultimately become channel regions in a nanowire-based device. Thus, at the process stage depicted in FIG. 9D, channel engineering or tuning may be performed. For example, in one embodiment, the discrete portions of the silicon layers 904 and 908 shown in FIG. 9D are thinned using oxidation and etch processes. Such an etch process may be performed at the same time the wires are separated by etching the silicon germanium layer 906. Accordingly, the initial wires formed from silicon layers 904 and 908 begin thicker and are thinned to a size suitable for a channel region in a nanowire device, independent from the sizing of the source and drain regions of the device. Thus, in an embodiment, forming the channel region includes removing a portion of the nanowire, and the resulting perimeters of the source and drain regions (described below) are greater than the perimeter of the resulting channel region.

Figure 9E:
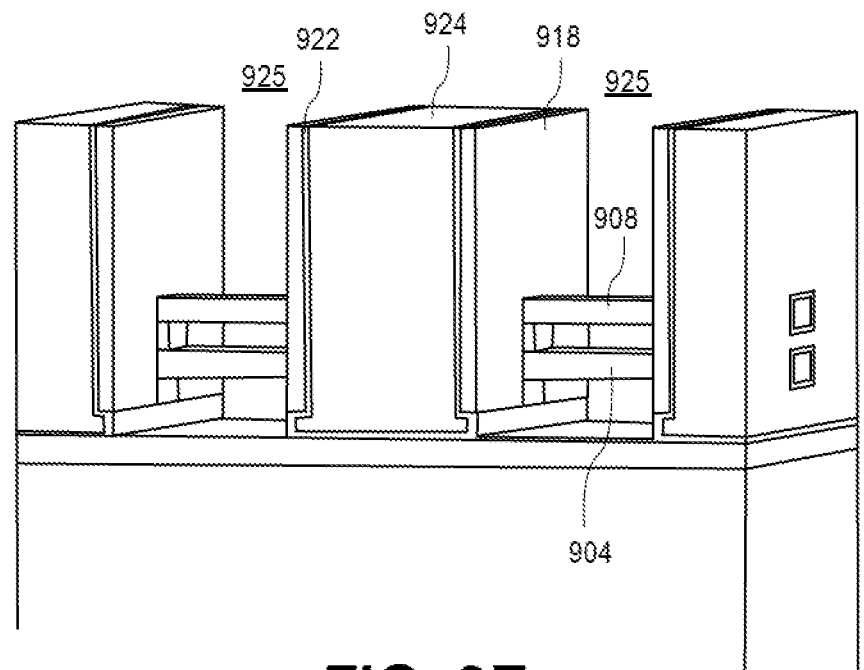

The method may also include forming a gate electrode stack surrounding the entire perimeter of the channel region. In the specific example showing the formation of three gate structures over the two silicon nanowires, FIG. 9E illustrates the structure following deposition of a gate dielectric layer 922 (such as a high-k gate dielectric layer) and a gate electrode layer 924 (such as a metal gate electrode layer), and subsequent polishing, in between the spacers 918. That is, gate structures are formed in the trenches 921 of FIG. 9D. Additionally, FIG. 9E depicts the result of the subsequent removal of the interlayer dielectric layer 920 after formation of the permanent gate stack. The portions of the silicon germanium layer 906 and the portion of the insulating silicon dioxide layer 902B of the fin structure 910 are also removed in the regions originally covered by the portion of the interlayer dielectric layer 920 depicted in FIG. 9D. Discrete portions of the silicon layers 904 and 908 thus remain, as depicted in FIG. 9E.

The method may also include forming a pair of source and drain regions in the nanowire, on either side of the channel region, each of the source and drain regions having a perimeter orthogonal to the length of the channel region. Specifically, the discrete portions of the silicon layers 904 and 908 shown in FIG. 9E will, in one embodiment, ultimately become at least a portion of the source and drain regions in a nanowire-based device. In one such embodiment, epitaxial source or drain structures are formed by merging epitaxial material around existing nanowires 904 and 908. In another embodiment, epitaxial source or drain structures are embedded, e.g., portions of nanowires 904 and 908 are removed and then source or drain (S/D) growth is performed. In the latter case, in accordance with an embodiment of the present disclosure, such epitaxial source or drain structures may be non-discrete, as exemplified in association with FIGS. 8A and 8B, or may be discrete, as exemplified in association with FIG. 4J. In either case, in one embodiment, source or drain structures are N-type epitaxial source or drain structures, both including phosphorous dopant impurity atoms.

The method may subsequently include forming a pair of contacts, a first of the pair of contacts completely or nearly completely surrounding the perimeter of the source region, and a second of the pair of contacts completely or nearly completely surrounding the perimeter of the drain region. In an embodiment, the pair of contacts is an asymmetric pair of source and drain contact structures, such as described in association with FIG. 4J. In other embodiments, the pair of contacts is a symmetric pair of source and drain contact structures. Specifically, contacts are formed in the trenches 925 of FIG. 9E following epitaxial growth. One of the trenches may first be recessed further than the other of the trenches. In an embodiment, the contacts are formed from a metallic species. In one such embodiment, the metallic species is formed by conformally depositing a contact metal and then filling any remaining trench volume. The conformal aspect of the deposition may be performed by using chemical vapor deposition (CVD), atomic layer deposition (ALD), or metal reflow.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, as described throughout, a substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

In an embodiment, as described throughout, a trench isolation layer may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, a trench isolation layer is composed of a dielectric material such as, but not limited to, silicon dioxide, silicon oxy-nitride, silicon nitride, or carbon-doped silicon nitride.

In an embodiment, as described throughout, self-aligned gate endcap isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
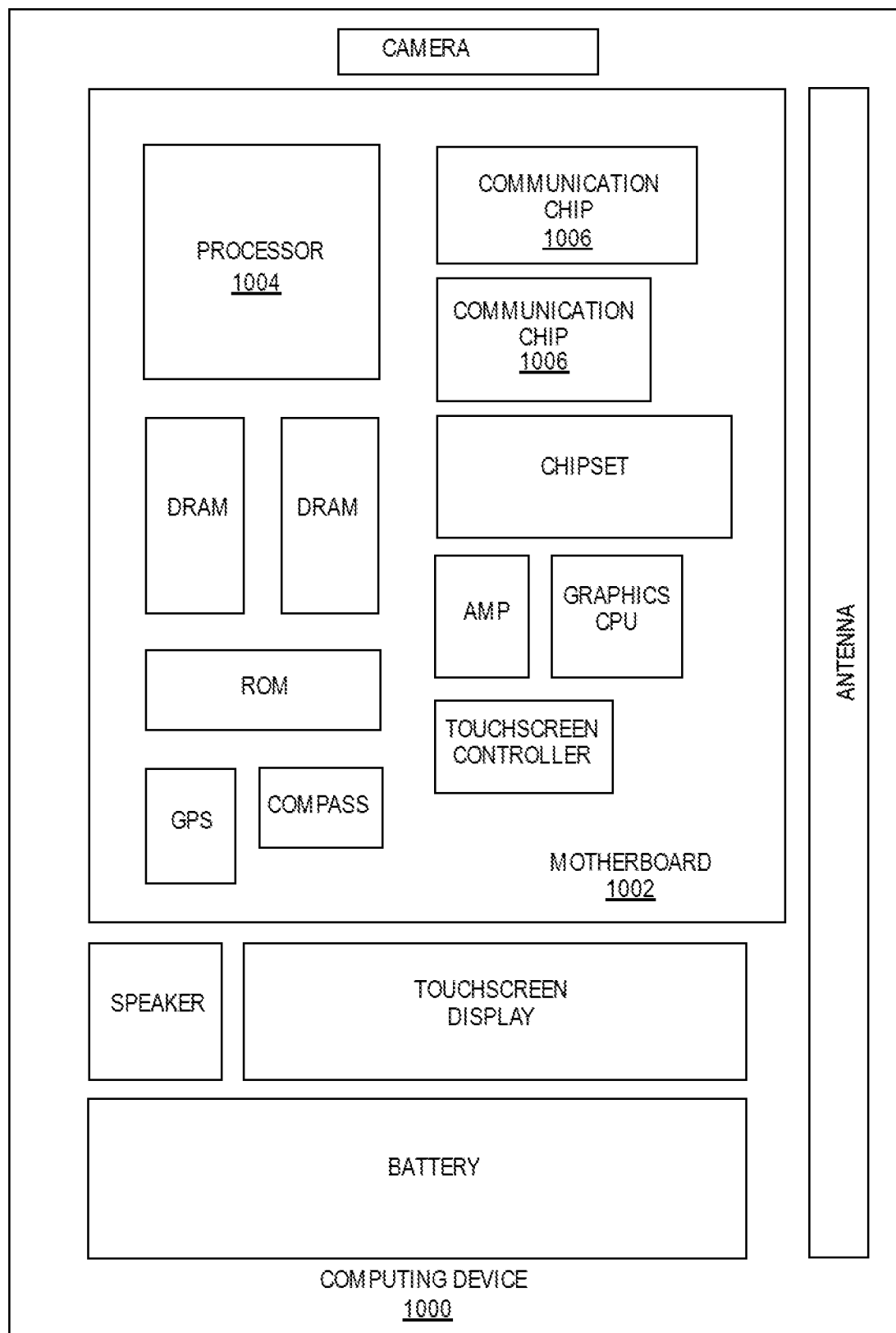
FIG. 10 illustrates a computing device in accordance with one implementation of an embodiment of the disclosure.

FIG. 10 illustrates a computing device 1000 in accordance with one implementation of an embodiment of the present disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as non-planar integrated circuit structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as non-planar integrated circuit structures built in accordance with implementations of embodiments of the present disclosure.

In further implementations, another component housed within the computing device 1000 may contain an integrated circuit die that includes one or structures, such as non-planar integrated circuit structures built in accordance with implementations of embodiments of the present disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
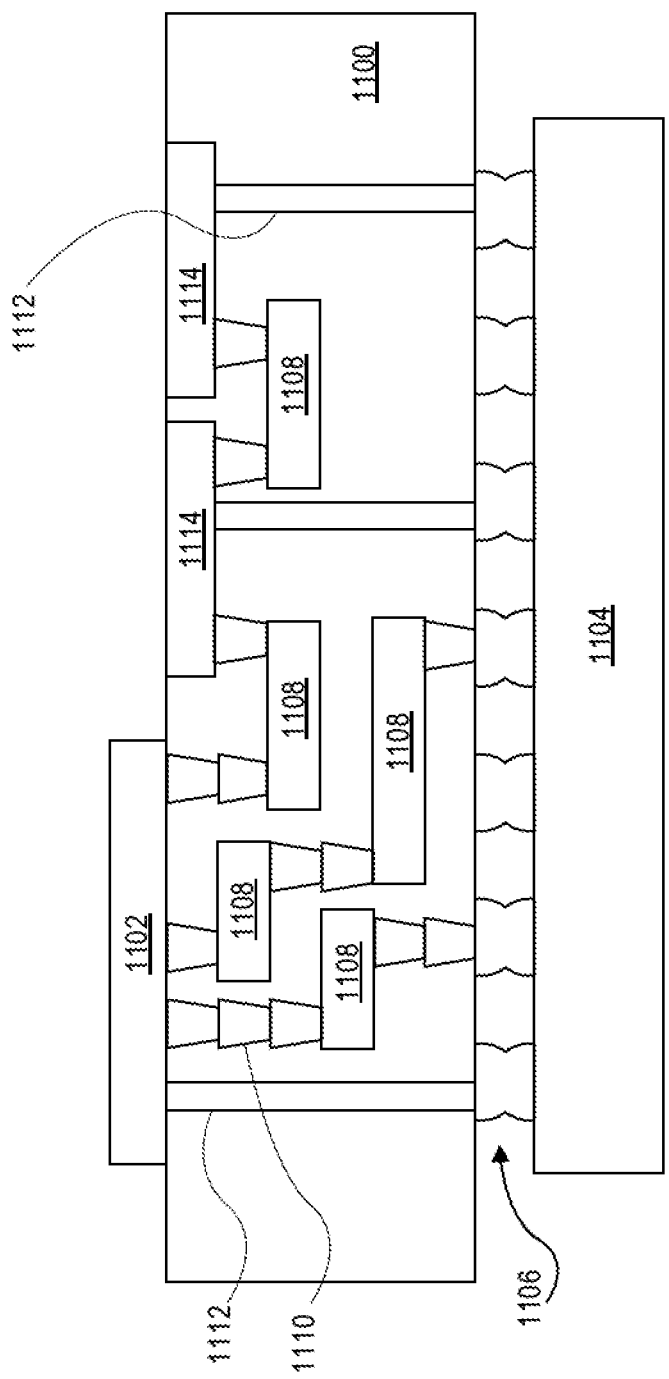
FIG. 11 illustrates an interposer that includes one or more embodiments of the disclosure.

FIG. 11 illustrates an interposer 1100 that includes one or more embodiments of the present disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100 or in the fabrication of components included in the interposer 1100.

Thus, embodiments of the present disclosure include non-planar integrated circuit structures having mitigated source or drain etch from replacement gate process.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a fin composed of silicon. A gate stack is over the fin, the gate stack including a gate dielectric and a gate electrode. A first dielectric spacer is along a first side of the gate stack, and a second dielectric spacer is along a second side of the gate stack. The first and second dielectric spacers are over at least a portion of the fin. An insulating material is vertically between and in contact with the portion of the fin and the first and second dielectric spacers. A first epitaxial source or drain structure is at the first side of the gate stack, and a second epitaxial source or drain structure is at the second side of the gate stack.

Example embodiment 2: The integrated circuit structure of example embodiment 1, wherein a portion of each of the first and second epitaxial source or drain structures is beneath a respective one of the first and second dielectric spacers.

Example embodiment 3: The integrated circuit structure of example embodiment 1, wherein no portion of each of the first and second epitaxial source or drain structures is beneath a respective one of the first and second dielectric spacers.

Example embodiment 4: The integrated circuit structure of example embodiment 1, 2 or 3, wherein the insulating material is in contact with the first and second epitaxial source or drain structures.

Example embodiment 5: The integrated circuit structure of example embodiment 1, 2, 3 or 4, wherein the insulating material is composed of a same material as the first and second dielectric spacers.

Example embodiment 6: The integrated circuit structure of example embodiment 1, 2, 3 or 4, wherein the insulating material is composed of a different material than the first and second dielectric spacers.

Example embodiment 7: The integrated circuit structure of example embodiment 1, 2, 3, 4, 5 or 6, wherein the insulating material includes silicon, nitrogen and carbon.

Example embodiment 8: The integrated circuit structure of example embodiment 1, 2, 3, 4, 5 or 6, wherein the insulating material includes silicon, oxygen and carbon.

Example embodiment 9: An integrated circuit structure includes a nanowire composed of silicon. A gate stack is around the nanowire, the gate stack including a gate dielectric and a gate electrode. A first dielectric spacer is along a first side of the gate stack, and a second dielectric spacer is along a second side of the gate stack. The first and second dielectric spacers are over at least a portion of the nanowire. An insulating material is vertically between and in contact with the portion of the nanowire and the first and second dielectric spacers. A first epitaxial source or drain structure is at the first side of the gate stack, and a second epitaxial source or drain structure is at the second side of the gate stack.

Example embodiment 10: The integrated circuit structure of example embodiment 9, wherein a portion of each of the first and second epitaxial source or drain structures is beneath a respective one of the first and second dielectric spacers.

Example embodiment 11: The integrated circuit structure of example embodiment 9, wherein no portion of each of the first and second epitaxial source or drain structures is beneath a respective one of the first and second dielectric spacers.

Example embodiment 12: The integrated circuit structure of example embodiment 9, 10 or 11, wherein the insulating material is in contact with the first and second epitaxial source or drain structures.

Example embodiment 13: The integrated circuit structure of example embodiment 9, 10, 11 or 12, wherein the insulating material is composed of a same material as the first and second dielectric spacers.

Example embodiment 14: The integrated circuit structure of example embodiment 9, 10, 11 or 12, wherein the insulating material is composed of a different material than the first and second dielectric spacers.

Example embodiment 15: The integrated circuit structure of example embodiment 9, 10, 11, 12, 13 or 14, wherein the insulating material includes silicon, nitrogen and carbon.

Example embodiment 16: The integrated circuit structure of example embodiment 9, 10, 11, 12, 13 or 14, wherein the insulating material includes silicon, oxygen and carbon.

Example embodiment 17: A method of fabricating an integrated circuit structure includes forming a semiconductor fin above a substrate. The method also includes forming a sacrificial gate stack over the semiconductor fin, the sacrificial gate stack including a dummy gate dielectric and a dummy gate electrode. The method also includes forming a first sacrificial dielectric spacer along a first side of the sacrificial gate stack, and a second sacrificial dielectric spacer along a second side of the sacrificial gate stack. The first and second sacrificial dielectric spacers are on at least a portion of the dummy gate dielectric. The method also includes removing the portion of the dummy gate dielectric from beneath the first and second sacrificial dielectric spacers. The method also includes removing the first and second sacrificial dielectric spacers. The method also includes, subsequent to removing the first and second sacrificial dielectric spacers, forming a first dielectric spacer along the first side of the sacrificial gate stack, and a second dielectric spacer along the second side of the sacrificial gate stack. The first and second dielectric spacers are on at least a portion of the semiconductor fin. The method also includes forming a first epitaxial source or drain structure at the first side of the sacrificial gate stack, and a second epitaxial source or drain structure at the second side of the sacrificial gate stack. The method also includes replacing the sacrificial gate stack with a permanent gate stack, the permanent gate stack including a permanent gate dielectric and a permanent gate electrode.

Example embodiment 18: The method of example embodiment 17, further including, subsequent to forming the first and second epitaxial source or drain structures and prior to replacing the sacrificial gate stack with the permanent gate stack, removing a portion of the semiconductor fin to form a nanowire.

Example embodiment 19: A method of fabricating an integrated circuit structure includes forming a semiconductor fin above a substrate. The method also includes forming a sacrificial gate stack over the semiconductor fin, the sacrificial gate stack including a dummy gate dielectric and a dummy gate electrode. The method also includes forming a first dielectric spacer along a first side of the sacrificial gate stack, and a second dielectric spacer along a second side of the sacrificial gate stack. The first and second dielectric spacers are on at least a portion of the dummy gate dielectric. The method also includes removing the portion of the dummy gate dielectric from beneath the first and second dielectric spacers. The method also includes forming an insulating material vertically between and in contact with a portion of the fin and the first and second dielectric spacers. The method also includes forming a first epitaxial source or drain structure at the first side of the sacrificial gate stack, and a second epitaxial source or drain structure at the second side of the sacrificial gate stack. The method also includes replacing the sacrificial gate stack with a permanent gate stack, the permanent gate stack including a permanent gate dielectric and a permanent gate electrode.

Example embodiment 20: The method of example embodiment 19, further including, subsequent to forming the first and second epitaxial source or drain structures and prior to replacing the sacrificial gate stack with the permanent gate stack, removing a portion of the semiconductor fin to form a nanowire.

What is claimed is:

1. An integrated circuit structure, comprising:
   a nanowire comprising silicon;
   a gate stack around the nanowire, the gate stack comprising a gate dielectric and a gate electrode;
   a first dielectric spacer along a first side of the gate stack, and a second dielectric spacer along a second side of the gate stack, the first and second dielectric spacers over at least a portion of the nanowire;
   an insulating material vertically between and in contact with the portion of the nanowire and the first and second dielectric spacers; and
   a first epitaxial source or drain structure at the first side of the gate stack, and a second epitaxial source or drain structure at the second side of the gate stack.

2. The integrated circuit structure of claim 1, wherein a portion of each of the first and second epitaxial source or drain structures is beneath a respective one of the first and second dielectric spacers.

3. The integrated circuit structure of claim 1, wherein no portion of each of the first and second epitaxial source or drain structures is beneath a respective one of the first and second dielectric spacers.

4. The integrated circuit structure of claim 1, wherein the insulating material is in contact with the first and second epitaxial source or drain structures.

5. The integrated circuit structure of claim 1, wherein the insulating material comprises a same material as the first and second dielectric spacers.

6. The integrated circuit structure of claim 1, wherein the insulating material comprises a different material than the first and second dielectric spacers.

7. The integrated circuit structure of claim 1, wherein the insulating material comprises silicon, nitrogen and carbon.

8. The integrated circuit structure of claim 1, wherein the insulating material comprises silicon, oxygen and carbon.

9. An integrated circuit structure, comprising:
   a nanowire;
   a gate stack around the nanowire, the gate stack comprising a gate dielectric and a gate electrode;
   a first dielectric spacer along and in contact with a first side of the gate stack, and a second dielectric spacer along and in contact with a second side of the gate stack, the first and second dielectric spacers over at least a portion of the nanowire;
   an insulating material vertically between and in contact with the portion of the nanowire and the first and second dielectric spacers, wherein the insulating material comprises a first dielectric material, and the first and second dielectric spacers comprise a second dielectric material different than the first dielectric material, and wherein the first dielectric material has a widest lateral width the same as a widest lateral width of the second dielectric material;

a first epitaxial source or drain structure at the first side of the gate stack, and a second epitaxial source or drain structure at the second side of the gate stack; and a first tip laterally adjacent to the first epitaxial source or drain structure, and a second tip laterally adjacent to the second epitaxial source or drain structure, the first tip and the second tip vertically beneath and in contact with the first dielectric material of the insulating material.

10. The integrated circuit structure of claim 9, wherein a portion of each of the first and second epitaxial source or drain structures is beneath a respective one of the first and second dielectric spacers.

11. The integrated circuit structure of claim 9, wherein no portion of each of the first and second epitaxial source or drain structures is beneath a respective one of the first and second dielectric spacers.

12. The integrated circuit structure of claim 9, wherein the insulating material is in contact with the first and second epitaxial source or drain structures.

13. The integrated circuit structure of claim 9, wherein the insulating material comprises silicon, nitrogen and carbon.

14. The integrated circuit structure of claim 9, wherein the insulating material comprises silicon, oxygen and carbon.

15. A computing device, comprising:
a board; and
a component coupled to the board, the component including an integrated circuit structure, comprising:
 a nanowire comprising silicon;
 a gate stack around the nanowire, the gate stack comprising a gate dielectric and a gate electrode;
 a first dielectric spacer along a first side of the gate stack, and a second dielectric spacer along a second side of the gate stack, the first and second dielectric spacers over at least a portion of the nanowire;
 an insulating material vertically between and in contact with the portion of the nanowire and the first and second dielectric spacers; and
 a first epitaxial source or drain structure at the first side of the gate stack, and a second epitaxial source or drain structure at the second side of the gate stack.

16. The computing device of claim 15, further comprising:
a memory coupled to the board.

17. The computing device of claim 15, further comprising:
a communication chip coupled to the board.

18. The computing device of claim 15, further comprising:
a battery coupled to the board.

19. The computing device of claim 15, wherein the component is a packaged integrated circuit die.

20. The computing device of claim 15, wherein the component is selected from the group consisting of a processor, a communications chip, and a digital signal processor.

* * * * *